United States Patent
Xie et al.

(10) Patent No.: US 12,446,290 B2
(45) Date of Patent: Oct. 14, 2025

(54) ASYMMETRIC GATE EXTENSION IN STACKED FET

(71) Applicant: INTERNATIONAL BUSINESS MACHINES CORPORATION, Armonk, NY (US)

(72) Inventors: Ruilong Xie, Niskayuna, NY (US); Brent A. Anderson, Jericho, VT (US); Junli Wang, Slingerlands, NY (US); Jay William Strane, Wappingers Falls, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 442 days.

(21) Appl. No.: 18/302,021

(22) Filed: Apr. 18, 2023

(65) Prior Publication Data

US 2024/0355679 A1    Oct. 24, 2024

(51) Int. Cl.
| | |
|---|---|
| *H10D 84/01* | (2025.01) |
| *H10D 84/03* | (2025.01) |
| *H10D 84/83* | (2025.01) |
| *H10D 88/00* | (2025.01) |

(52) U.S. Cl.
CPC ....... *H10D 84/0142* (2025.01); *H10D 84/038* (2025.01); *H10D 84/83* (2025.01); *H10D 88/01* (2025.01)

(58) Field of Classification Search
CPC ............ H10D 30/01; H10D 30/014; H10D 30/019–0198; H10D 30/024; H10D 30/43; H10D 30/435; H10D 30/501–509; H10D 30/60; H10D 30/62; H10D 30/6735; H10D 30/674; H10D 30/6757; H10D 62/121; H10D 84/01; H10D 84/0128; H10D 84/0142; H10D 84/0193; H10D 84/038; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839; H10D 88/00; H10D 88/01
See application file for complete search history.

(56) References Cited

U.S. PATENT DOCUMENTS

| | | |
|---|---|---|
| 9,607,988 B2 | 3/2017 | Liu |
| 9,659,963 B2 | 5/2017 | Cheng |
| 9,837,414 B1 | 12/2017 | Balakrishnan |
| 10,192,867 B1 | 1/2019 | Frougier |
| 10,417,369 B2 | 9/2019 | Chen |

(Continued)

*Primary Examiner* — Cheung Lee
(74) *Attorney, Agent, or Firm* — Yuanmin Cai

(57) ABSTRACT

Embodiments of present invention provide a semiconductor structure. The semiconductor structure includes a stack of transistors with a first transistor on top of a second transistor, where a gate of the first transistor has a first width; a gate of the second transistor has a second width; and the first width is narrower than the second width, and where the first and the second transistor respectively have a first gate extension at a first side of the stack and a second gate extension at a second side of the stack, the first gate extension at the first side of the stack being narrower than the second gate extension at the second side of the stack, with the first side being opposite the second side. A method of manufacturing the semiconductor structure is also provided.

20 Claims, 17 Drawing Sheets

(X-X)

(Y-Y)

(56) References Cited

U.S. PATENT DOCUMENTS

| | | |
|---|---|---|
| 11,011,528 B2 | 5/2021 | Reznicek |
| 2021/0305261 A1 | 9/2021 | Chen |
| 2021/0407999 A1 | 12/2021 | Huang |

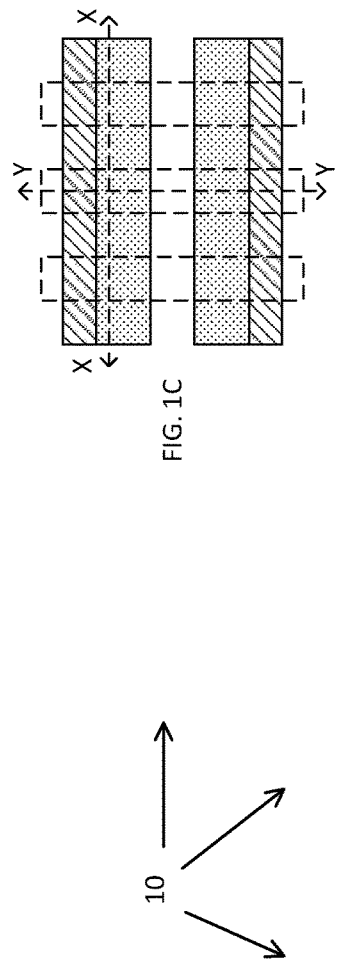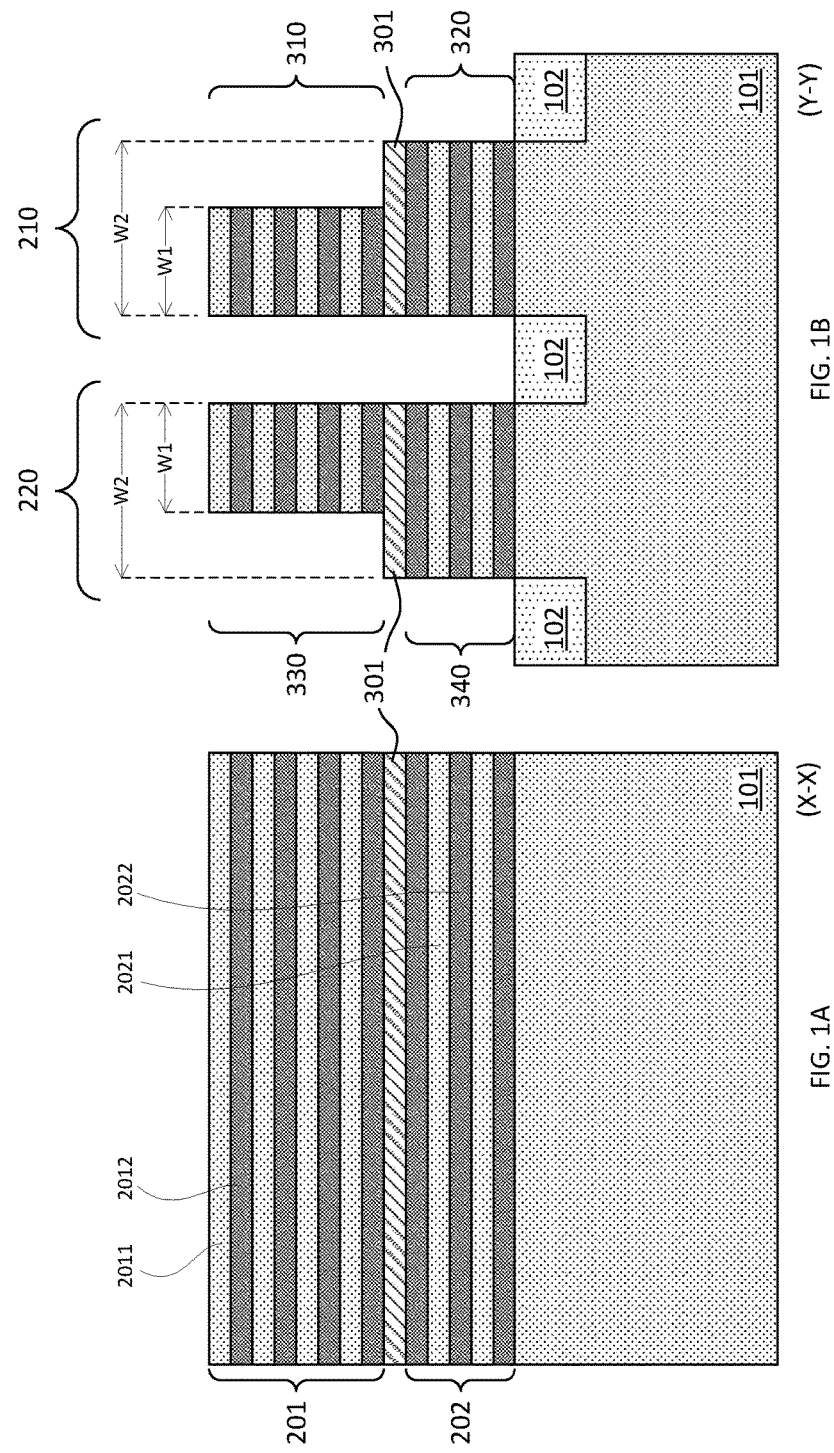

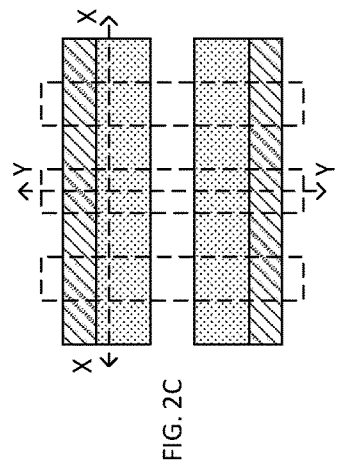
FIG. 2C
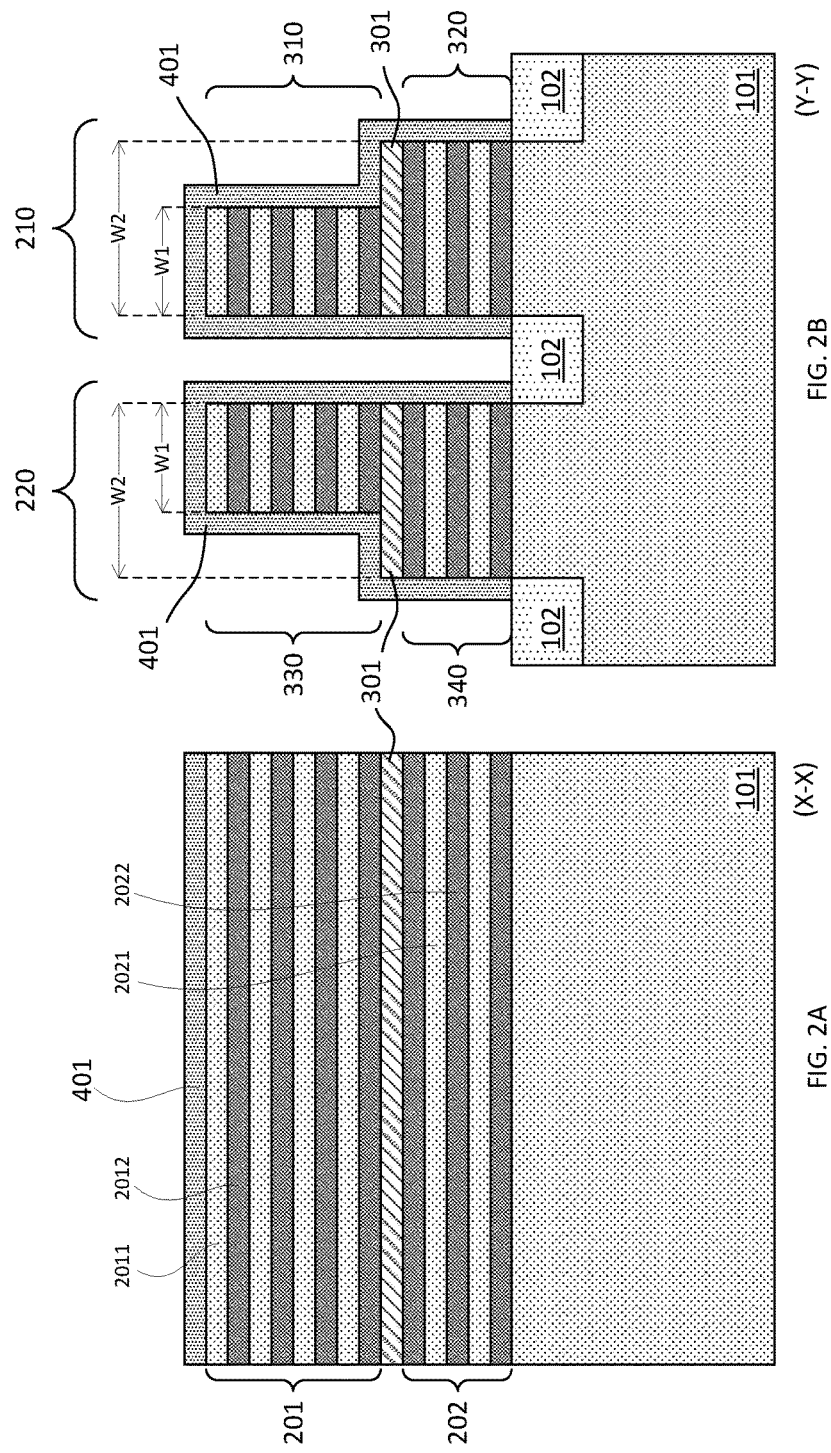
FIG. 2A (X-X)
FIG. 2B (Y-Y)

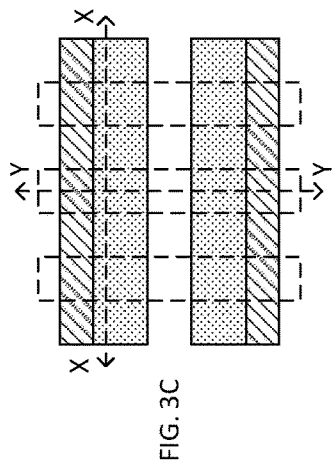
FIG. 3C
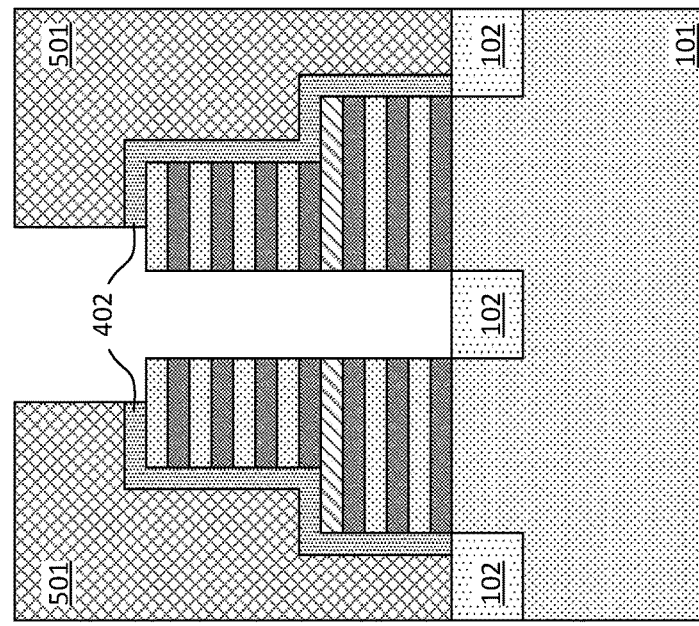
FIG. 3B (Y-Y)
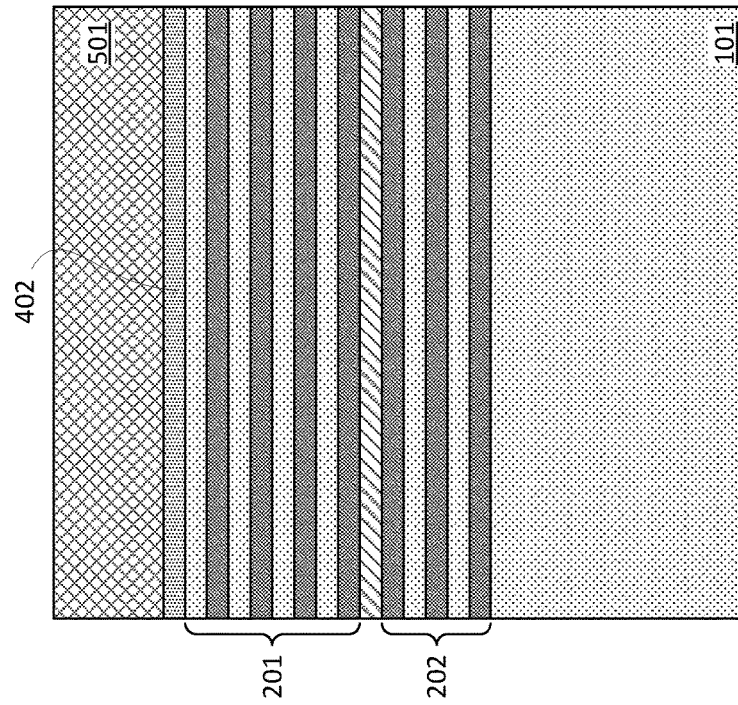
FIG. 3A (X-X)

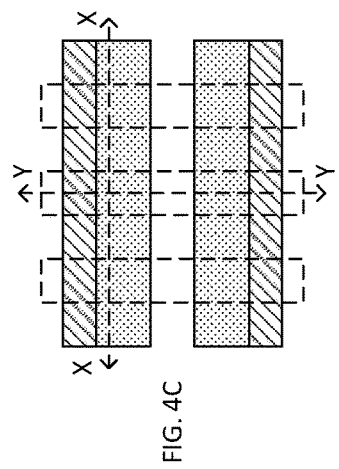
FIG. 4C
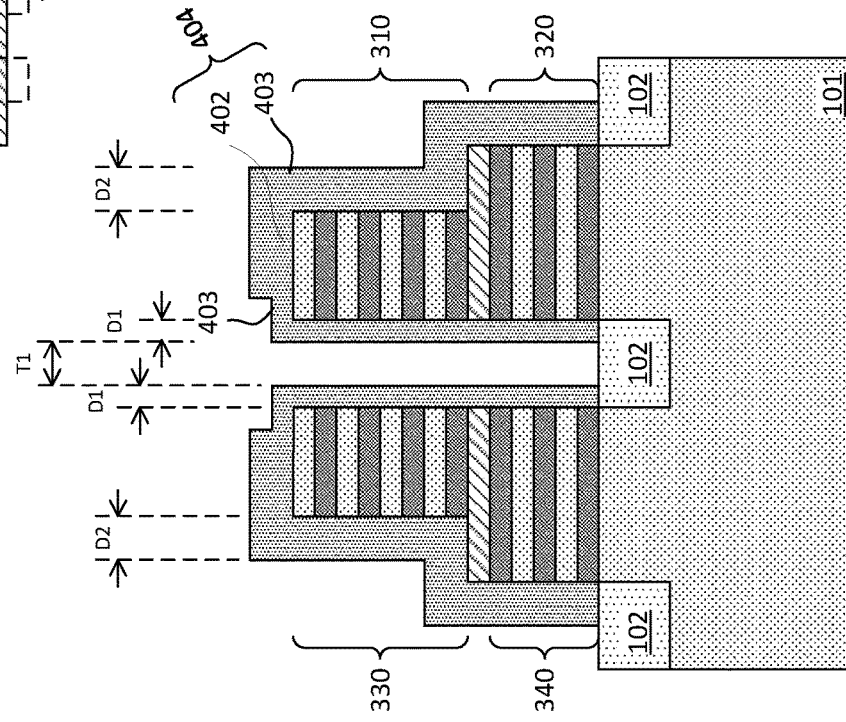
FIG. 4B (Y-Y)
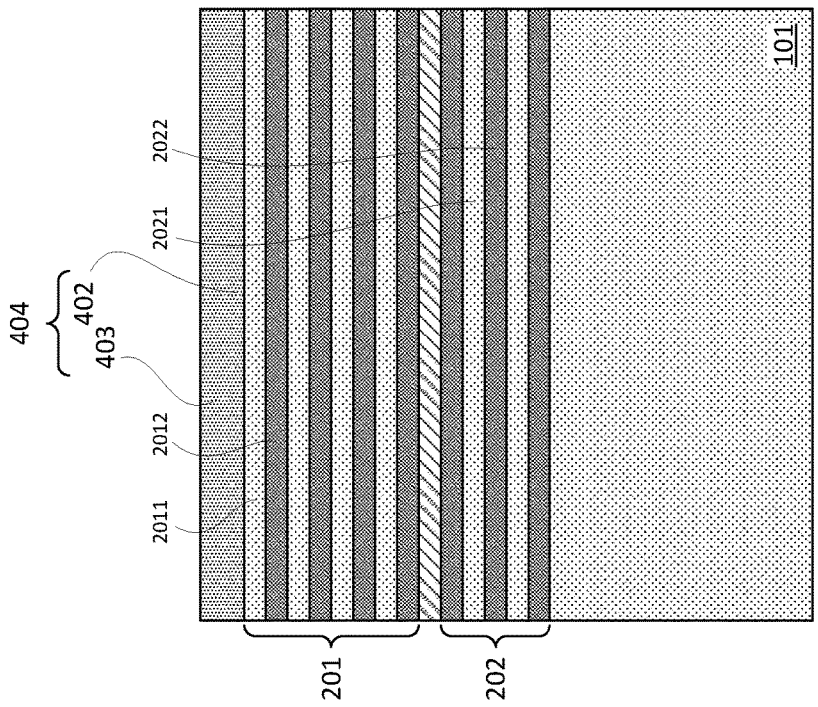
FIG. 4A (X-X)

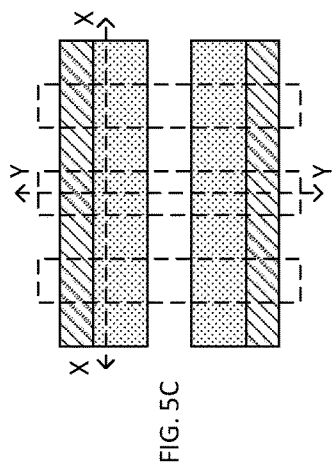
FIG. 5C
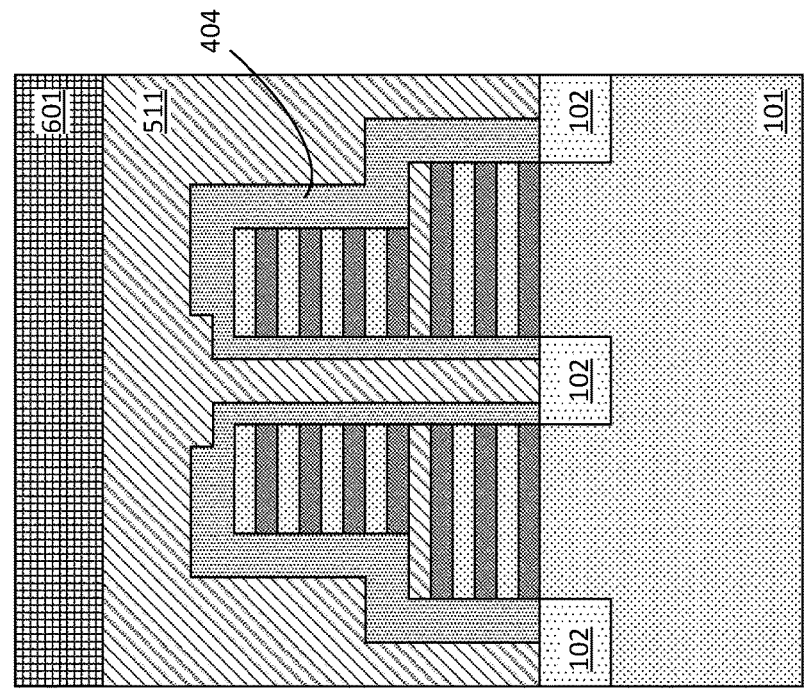
FIG. 5B (Y-Y)
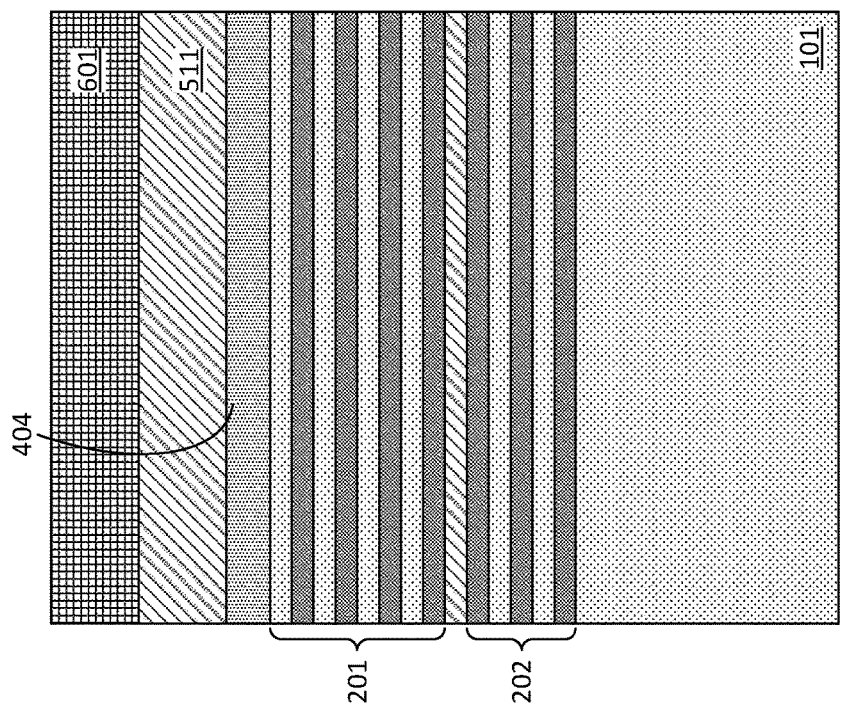
FIG. 5A (X-X)

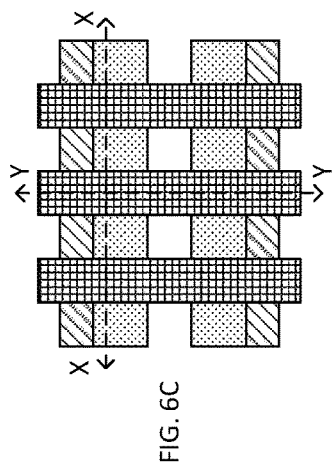
FIG. 6C
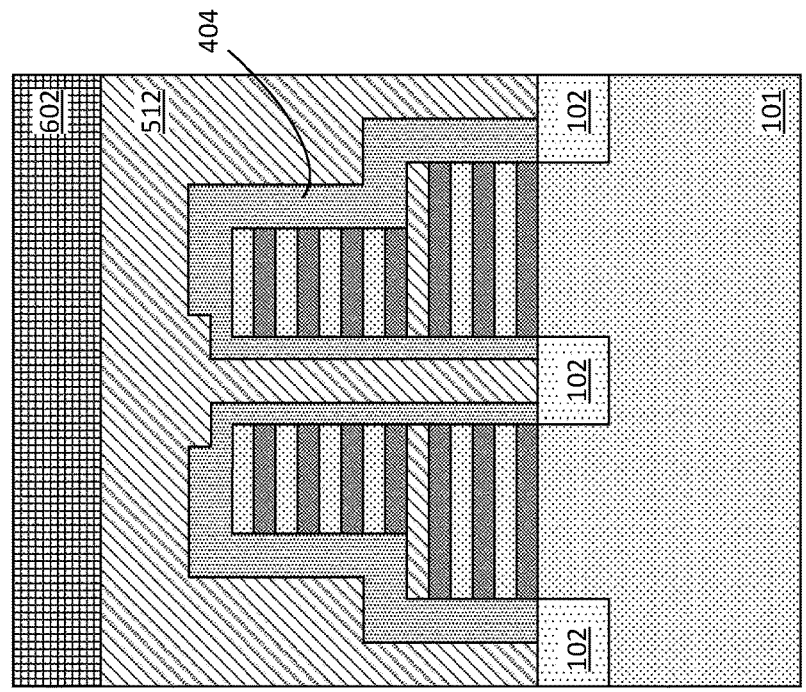
FIG. 6B (Y-Y)
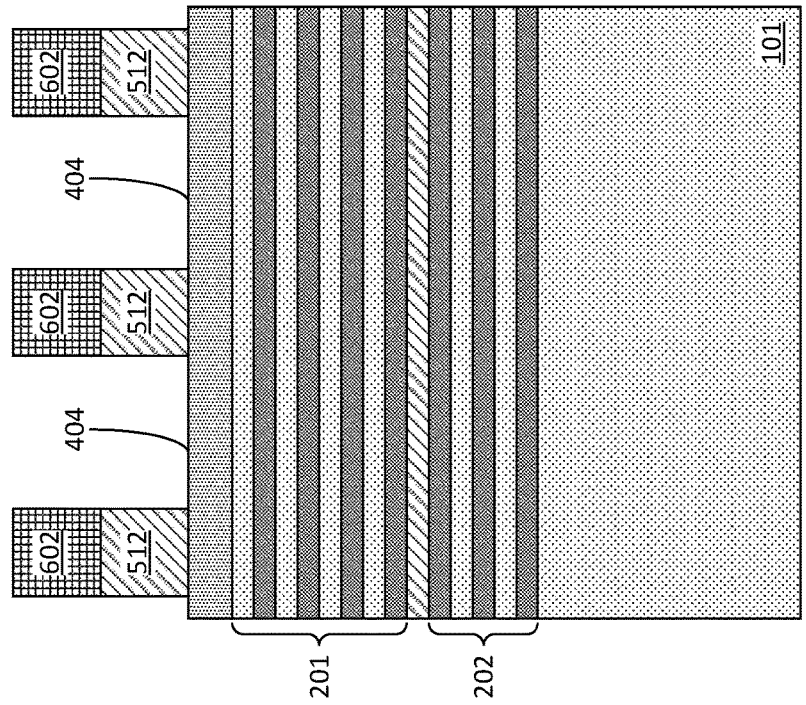
FIG. 6A (X-X)

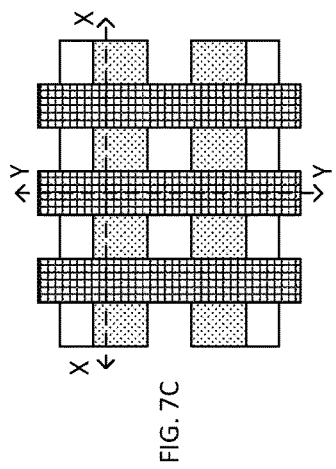
FIG. 7C
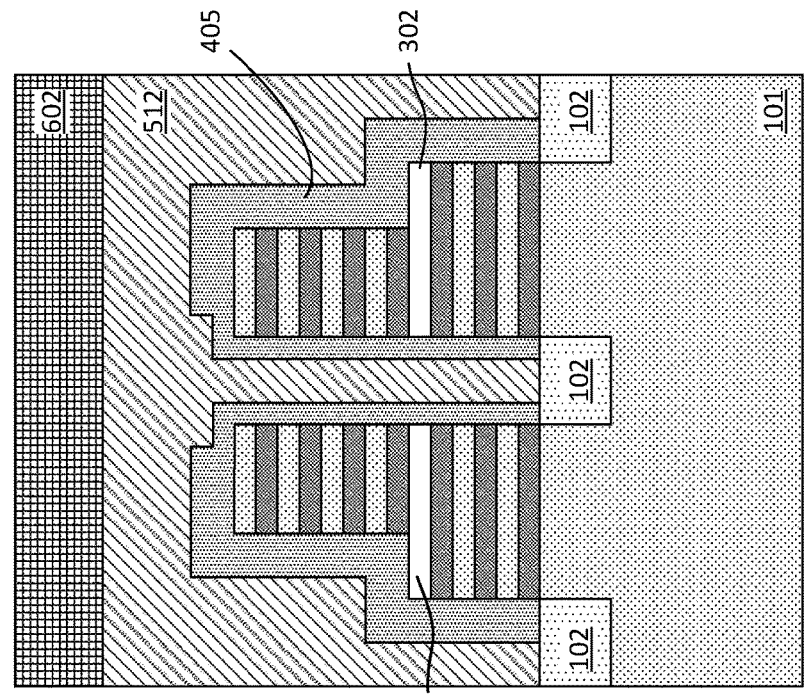
FIG. 7B (Y-Y)
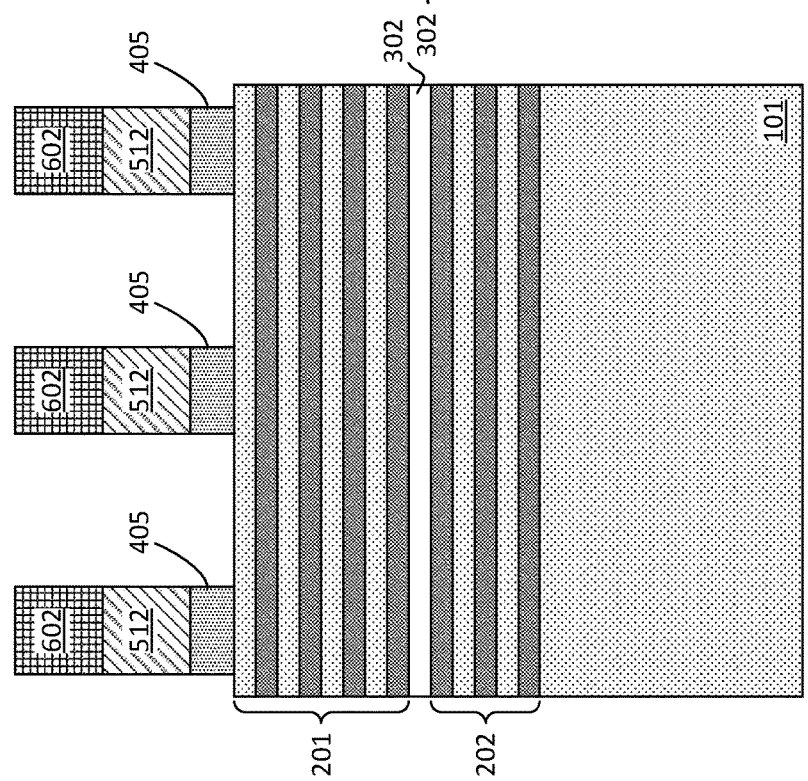
FIG. 7A (X-X)

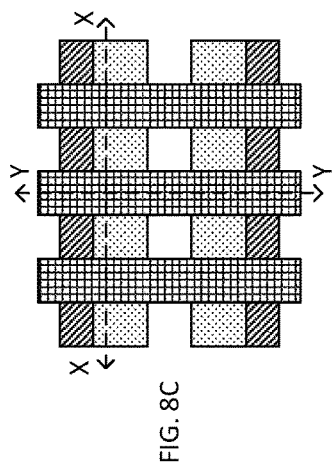
FIG. 8C
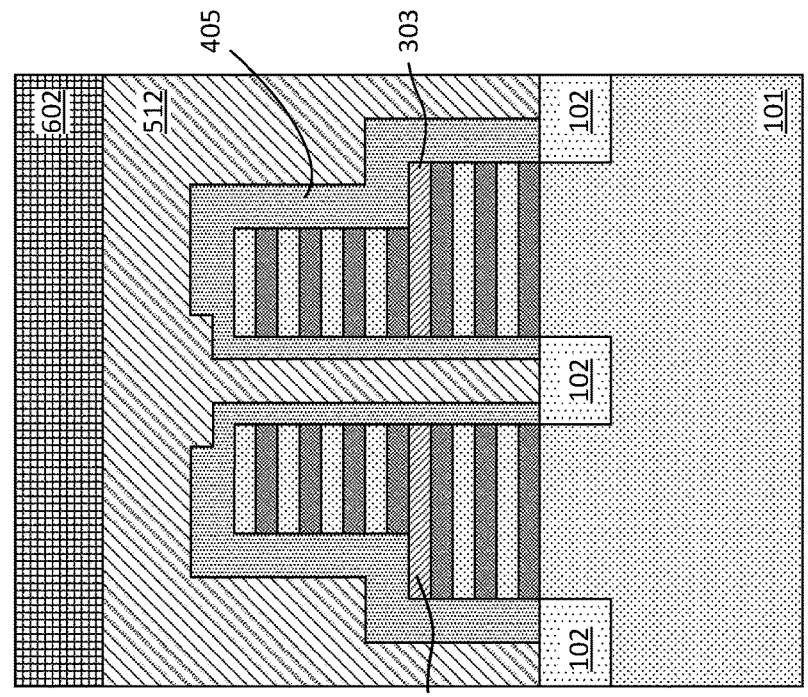
FIG. 8B (Y-Y)
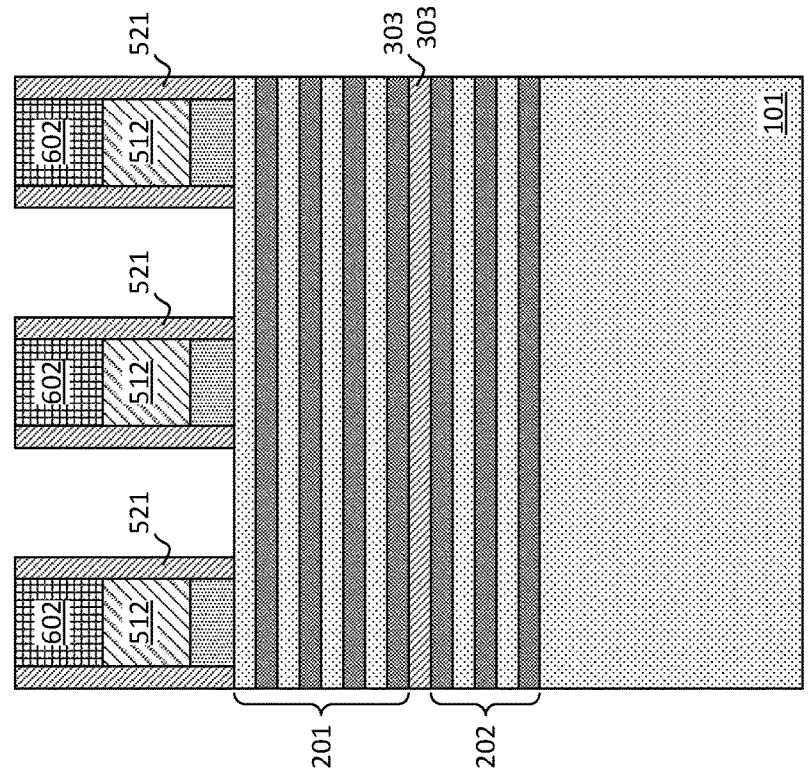
FIG. 8A (X-X)

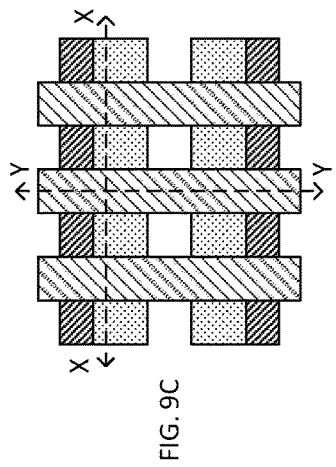
FIG. 9C
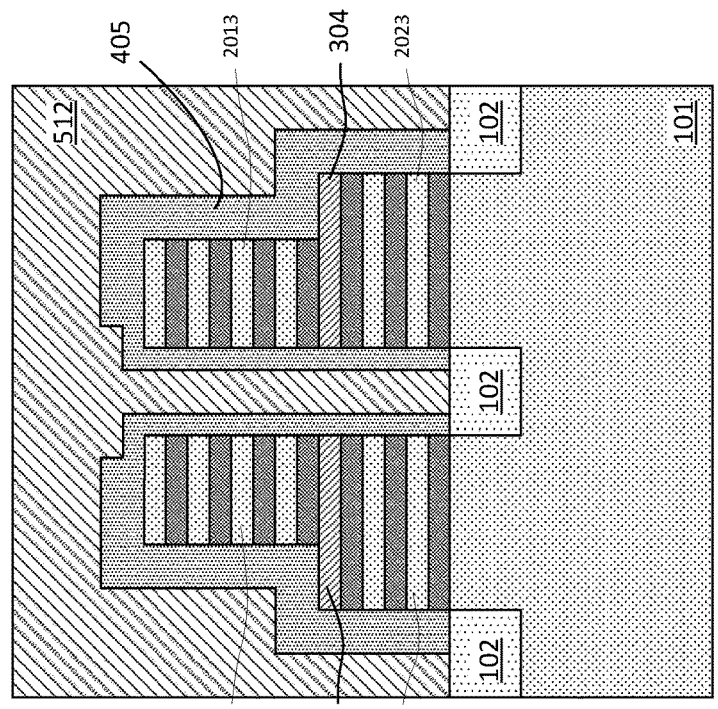
FIG. 9B (Y-Y)
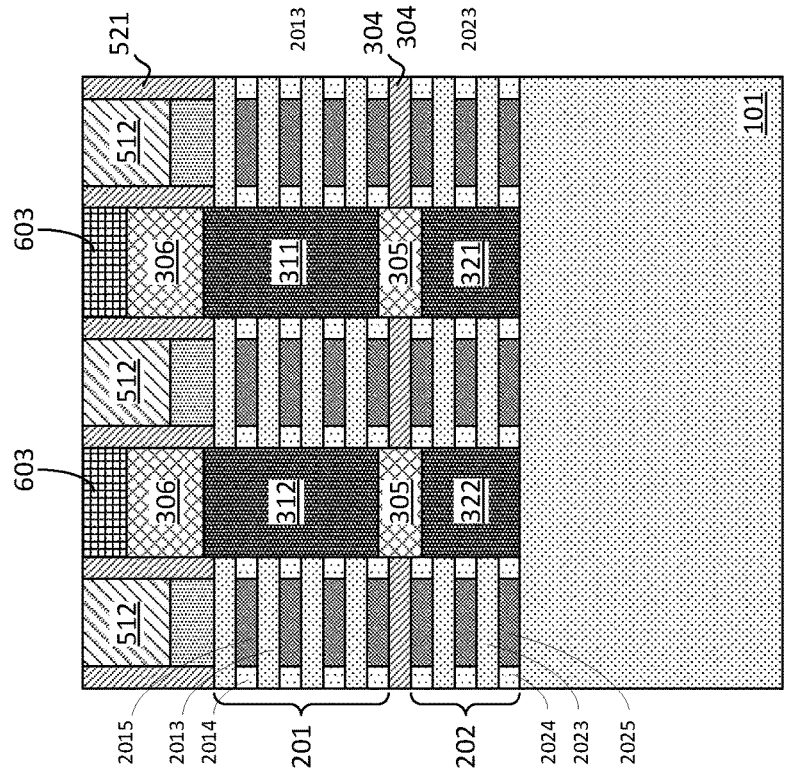
FIG. 9A (X-X)

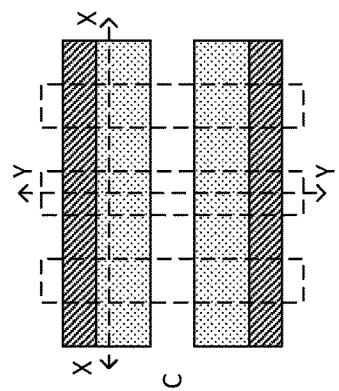
FIG. 11C
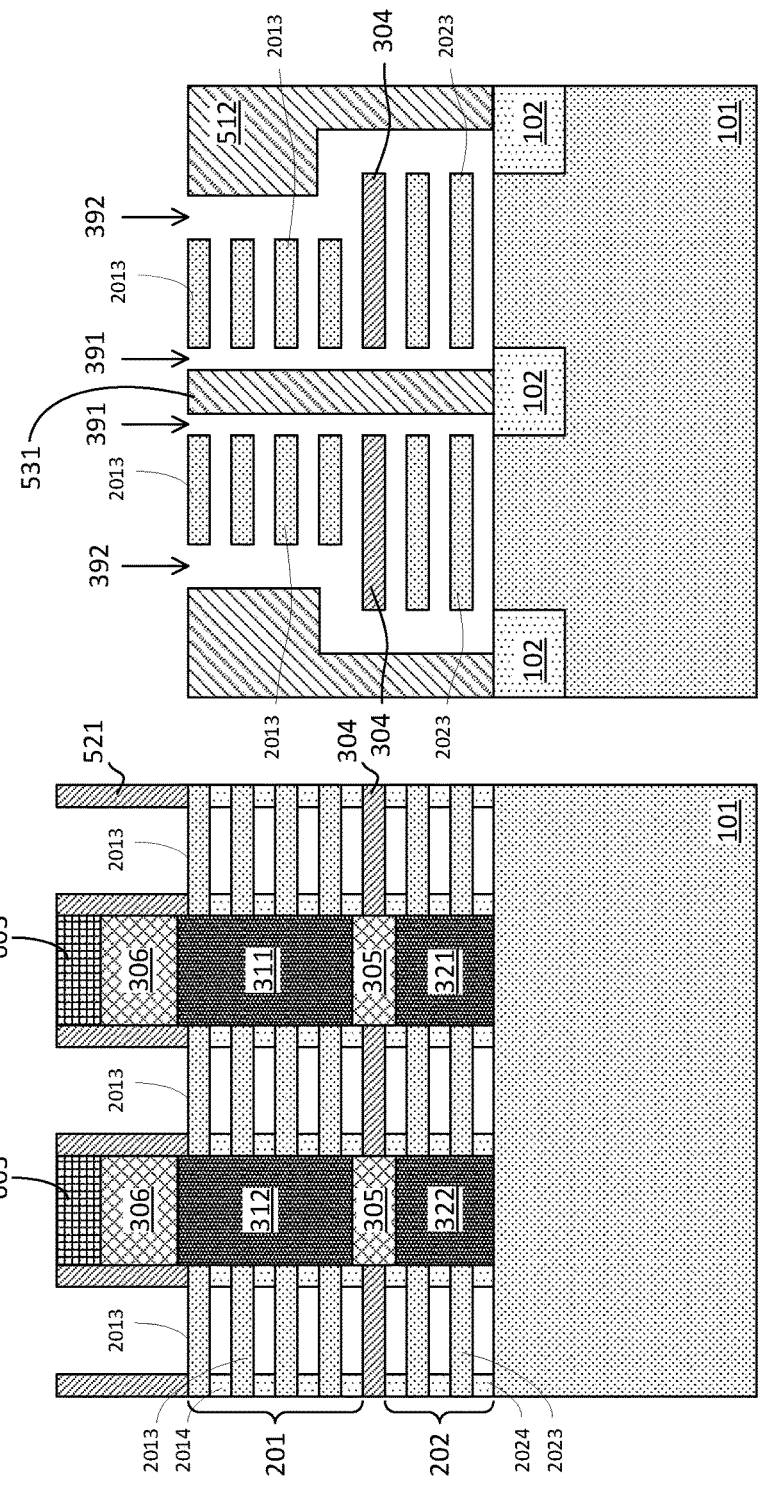
FIG. 11B (Y-Y)
FIG. 11A (X-X)

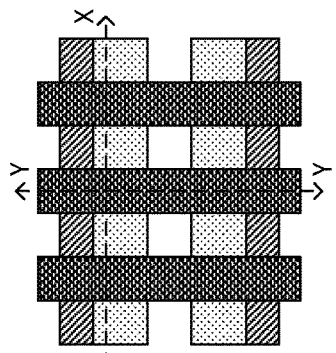
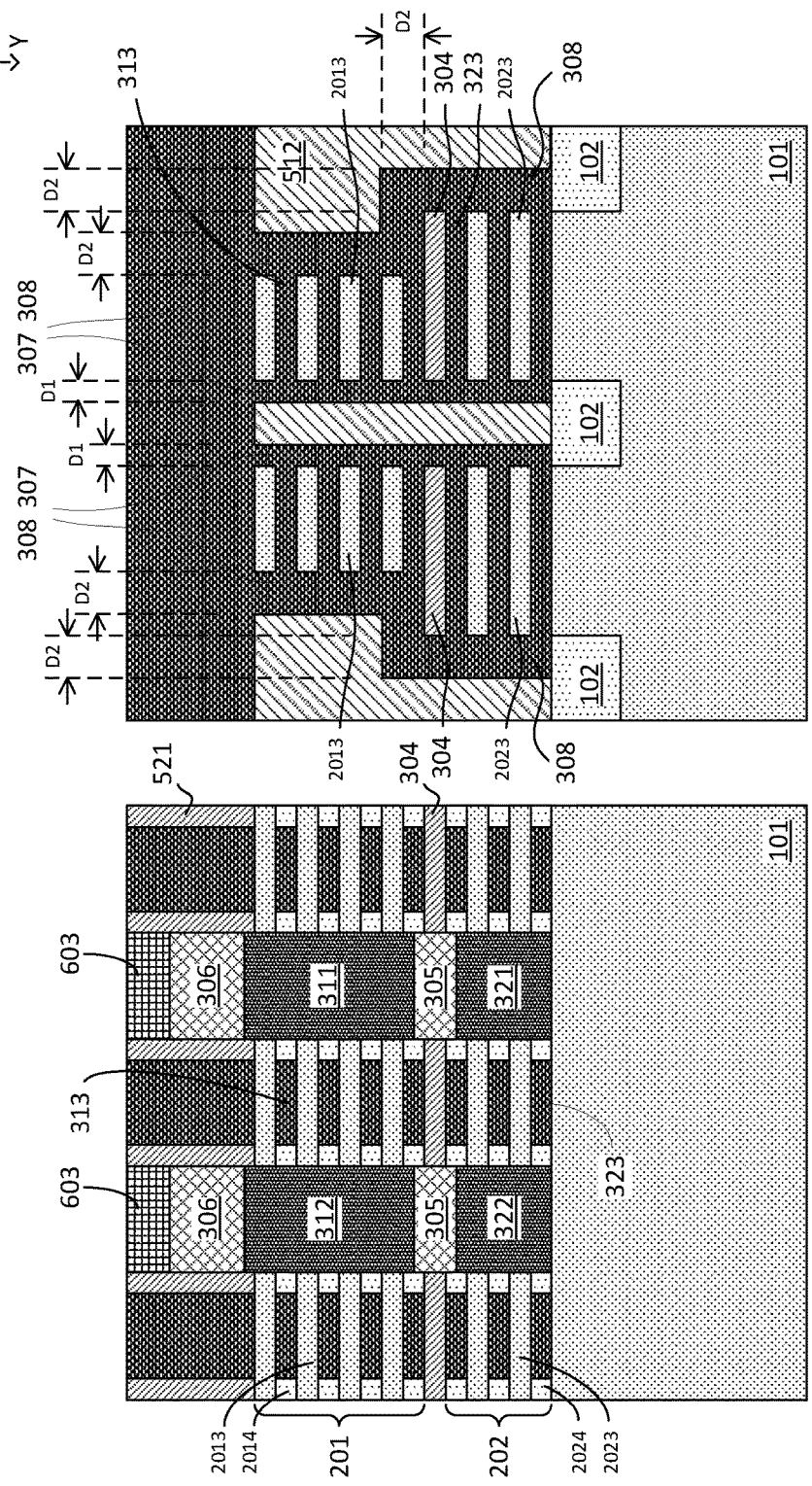
FIG. 12C
FIG. 12B (Y-Y)
FIG. 12A (X-X)

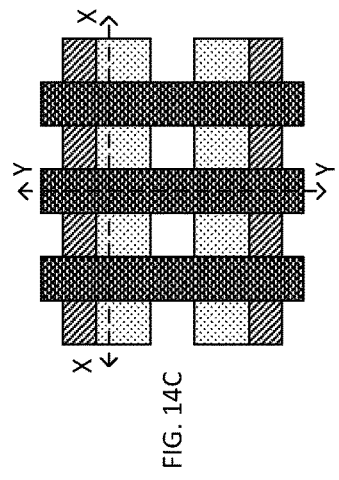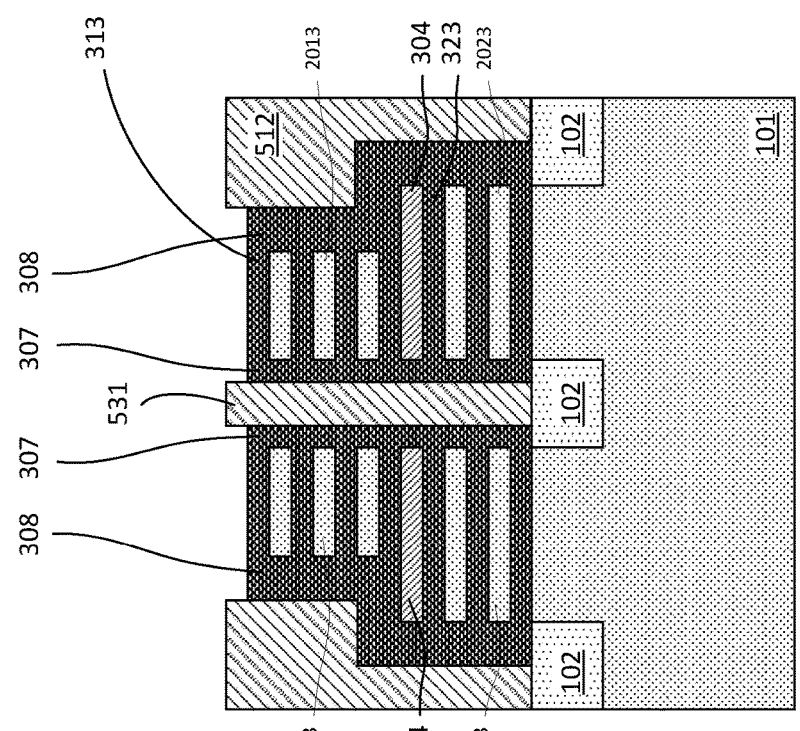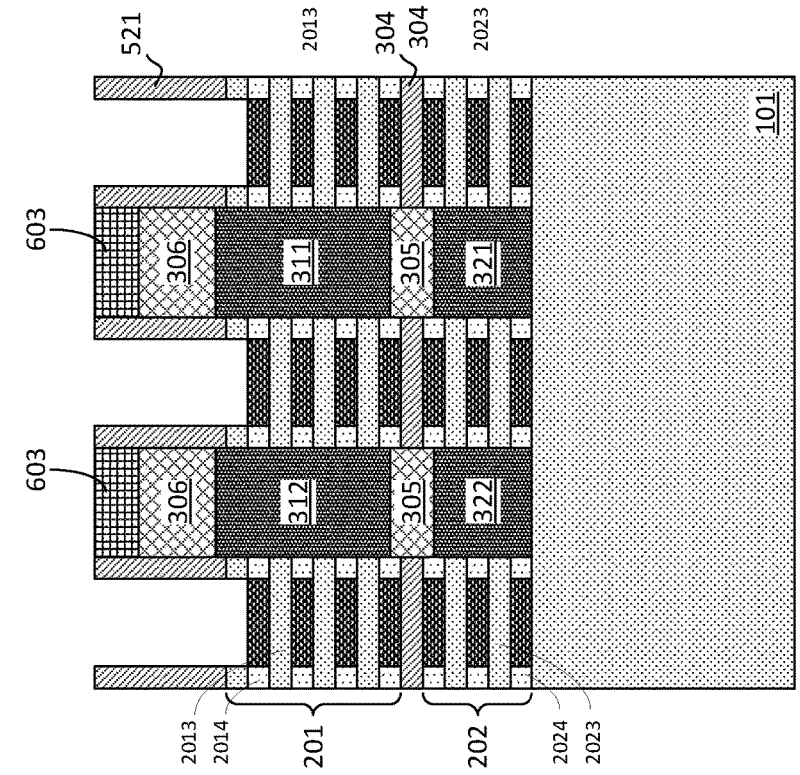

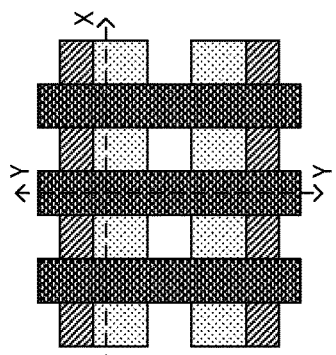
FIG. 15C
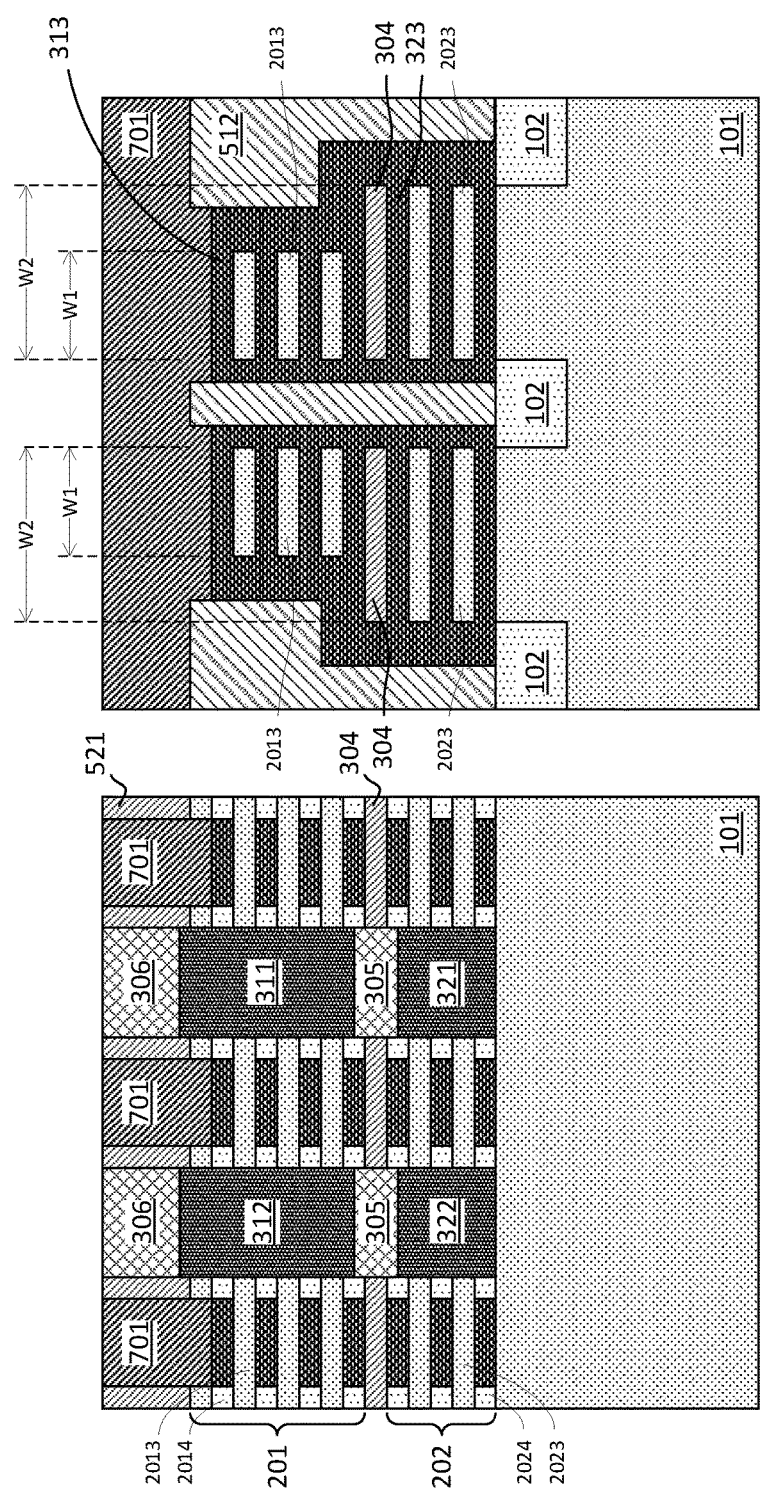
FIG. 15B (Y-Y)
FIG. 15A (X-X)

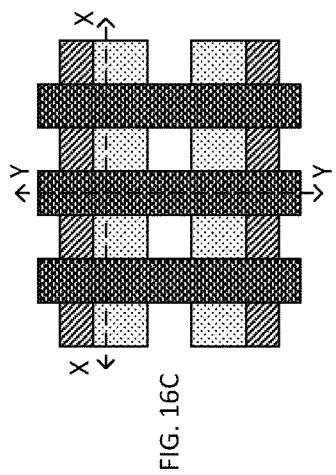
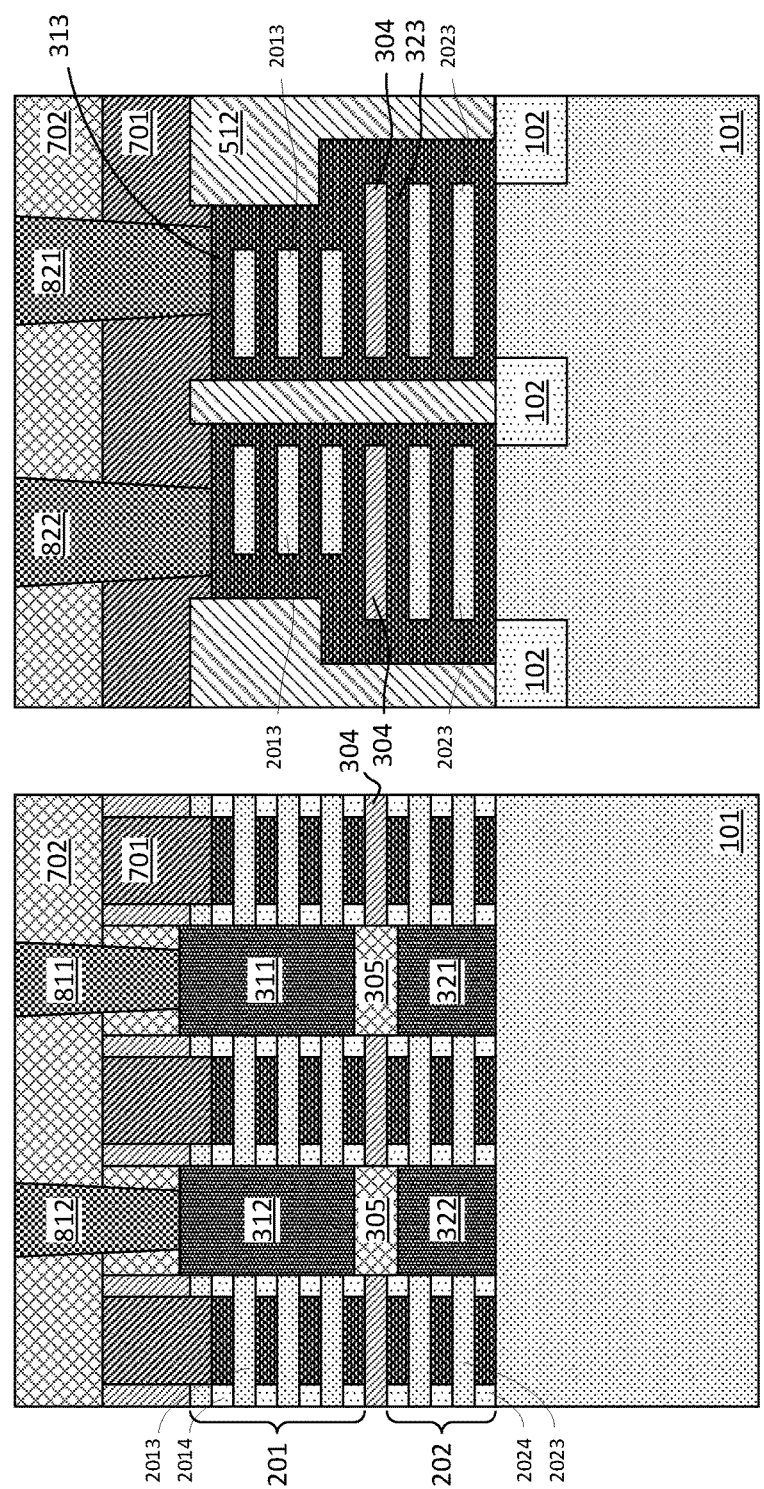
FIG. 16C
FIG. 16B (Y-Y)
FIG. 16A (X-X)

ASYMMETRIC GATE EXTENSION IN STACKED FET

BACKGROUND

The present application relates to manufacturing of semiconductor integrated circuits. More particularly, it relates to asymmetric gate extension in stacked field-effect-transistors and method of manufacturing the same.

With the advancement of semiconductor manufacturing capability, semiconductor devices are moving toward smaller and smaller nodes such as, for example, 7-nm node, 5-nm node, and beyond. Field-effect-transistors (FETs) are being aggressively scaled to fit into reduced footprint or real estate space, as often defined by their node, with increased device density. In addition, FETs may be stacked together with one on top of another in a 3D integration scheme to further increase density and functionality of the device using the FETs.

FETs may include, by structure, planar FETs, fin-type FETs, vertical FETs, nanosheet transistors, and nanowire transistors. FETs may also include, by carrier type, p-type transistors (PFETs) and n-type transistors (NFETs) that use different carriers of either holes or electrons. Gate conductors, with different work-function metals for either PFET or NFET, may be formed to surround channel regions of the FETs.

With the aggressive scaling to place FETs closer than ever before such as placing one FET on top of another FET, and in particular when placing nanosheet transistors closer together, a challenge remains to be forming gate conductors of nanosheet transistors with adequate amount of gate extension without causing short between adjacent nanosheet transistors.

SUMMARY

Embodiments of present invention provide a semiconductor structure. The structure includes a stack of transistors with a first transistor on top of a second transistor, where a gate of the first transistor has a first width; a gate of the second transistor has a second width; and the first width is narrower than the second width, and where the first and the second transistor respectively have a first gate extension at a first side of the stack and a second gate extension at a second side of the stack, the first gate extension at the first side of the stack being narrower than the second gate extension at the second side of the stack, the first side being opposite the second side.

In one embodiment, the second gate extensions of the first and the second transistor at the second side of the stack are conformal, and the second gate extension of the first transistor conformally extends into the second gate extension of the second transistor.

In another embodiment, the gate of the first transistor vertically aligns with the gate of the second transistor at the first side of the stack.

In one embodiment, the first and the second transistor are a first and a second nanosheet transistor having a first and a second set of nanosheets respectively, and the first width of the gate of the first transistor equals to a width of the first set of nanosheets and the second width of the gate of the second transistor equals to a width of the second set of nanosheets.

In another embodiment, the first set of nanosheets are vertically separated by a distance ranging from about 6 nm to about 20 nm.

According to one embodiment, the stack of transistors is a first stack of transistors, and the semiconductor structure further includes a second stack of transistors with a third transistor on top of a fourth transistor, where a gate of the third transistor has a third width; a gate of the fourth transistor has a fourth width; and the third width is narrower than the fourth width, where the second stack of transistors being opposite the first side of the first stack of transistors, and where the third and the fourth transistor respectively have a third gate extension at a first side of the second stack and a fourth gate extension at a second side of the second stack, the third gate extension at the first side of the second stack being narrower than the fourth gate extension at the second side of the second stack, the second side of the second stack being opposite the first side of the second stack.

In one embodiment, the first gate extensions of the first and the second transistor are separated from the third gate extensions of the third and the fourth transistor by a dielectric pillar, the dielectric pillar having a width ranging from about 5 nm to about 50 nm.

In another embodiment, the first gate extension and the third gate extension have a substantially same first width, and the second gate extension and the fourth gate extension have a substantially same second width, the first width of the first gate extension being narrower than the second width of the second gate extension.

Embodiments of present invention further provide a method of forming a semiconductor structure. The method includes forming a stack of nanosheets including a first set of nanosheets on top of a second set of nanosheets, the first set of nanosheets having a first width, the second set of nanosheets having a second width, and the first width being narrower than the second width; and forming a first gate extension on a first side of the stack of nanosheets and a second gate extension on a second side of the stack of nanosheets, the first side being opposite the second side, and the first gate extension being narrower than the second gate extension.

In one embodiment, forming the first gate extension and the second gate extension includes forming a first extension placeholder at the first side of the stack of nanosheets and a second extension placeholder at the second side of the stack of nanosheets; and replacing the first extension placeholder with the first gate extension and the second extension placeholder with the second gate extension in a replacement-metal-gate process.

In one embodiment, forming the first extension placeholder and the second extension placeholder includes forming a first raw placeholder layer at the second side of the stack of nanosheets; forming a second raw placeholder layer at the first side of the stack of nanosheets and at the second side of the stack of nanosheets over the first raw placeholder layer; patterning the second raw placeholder layer at the first side of the stack of nanosheets to form the first extension placeholder; and patterning the first and the second raw placeholder layer at the second side of the stack of nanosheets to form the second extension placeholder.

In another embodiment, forming the first extension placeholder and the second extension placeholder includes forming a first raw placeholder layer at the first and the second side of the stack of nanosheets; forming a second raw placeholder layer at the second side of the stack of nanosheets over the first raw placeholder layer; patterning the first raw placeholder layer at the first side of the stack of nanosheets to form the first extension placeholder; and patterning the first and the second raw placeholder layer at the second side of the stack of nanosheets to form the second extension placeholder.

In one embodiment, forming the stack of nanosheets includes forming a second set of raw nanosheets on a semiconductor substrate, the second set of raw nanosheets are separated by a second set of raw suspension sheets; forming a sacrificial insulation sheet above the second set of raw nanosheets; forming a first set of raw nanosheets above the sacrificial insulation sheet, the first set of raw nanosheets are separated by a first set of raw suspension sheets; and patterning the first and the second set of raw nanosheets to create the first and the second set of nanosheets in a selective etching process.

According to one embodiment, the method further includes removing the sacrificial insulation sheet in a selective etching process to create an opening between the first and the second set of raw nanosheets; and forming a raw insulation sheet by depositing a dielectric material in the opening, where the first and the second set of raw suspension sheets are silicon-germanium (SiGe) sheets having a first germanium (Ge) concentration level and the sacrificial insulation sheet is a SiGe sheet having a second Ge concentration level, the second Ge concentration level being larger than the first Ge concentration level.

According to another embodiment, the stack of nanosheets is a first stack of nanosheets, and the method further includes forming a second stack of nanosheets opposite the first side of the first stack of nanosheets, where the second stack of nanosheets includes a third set of nanosheets on top of a fourth set of nanosheets, the third set of nanosheets having a third width, the fourth set of nanosheets having a fourth width, the third width being narrower than the fourth width.

BRIEF DESCRIPTION OF THE DRAWINGS

The present invention will be understood and appreciated more fully from the following detailed description of embodiments of present invention, taken in conjunction with accompanying drawings of which:

FIGS. 1A and 1B are demonstrative illustrations of cross-sectional views and FIG. 1C is a simplified top view of layout of a semiconductor structure in a step of manufacturing thereof according to one embodiment of present invention;

FIGS. 2A and 2B are demonstrative illustrations of cross-sectional views and FIG. 2C is a simplified top view of layout of a semiconductor structure in a step of manufacturing thereof according to one embodiment of present invention;

FIGS. 3A and 3B are demonstrative illustrations of cross-sectional views and FIG. 3C is a simplified top view of layout of a semiconductor structure in a step of manufacturing thereof according to one embodiment of present invention;

FIGS. 4A and 4B are demonstrative illustrations of cross-sectional views and FIG. 4C is a simplified top view of layout of a semiconductor structure in a step of manufacturing thereof according to one embodiment of present invention;

FIGS. 5A and 5B are demonstrative illustrations of cross-sectional views and FIG. 5C is a simplified top view of layout of a semiconductor structure in a step of manufacturing thereof according to one embodiment of present invention;

FIGS. 6A and 6B are demonstrative illustrations of cross-sectional views and FIG. 6C is a simplified top view of layout of a semiconductor structure in a step of manufacturing thereof according to one embodiment of present invention;

FIGS. 7A and 7B are demonstrative illustrations of cross-sectional views and FIG. 7C is a simplified top view of layout of a semiconductor structure in a step of manufacturing thereof according to one embodiment of present invention;

FIGS. 8A and 8B are demonstrative illustrations of cross-sectional views and FIG. 8C is a simplified top view of layout of a semiconductor structure in a step of manufacturing thereof according to one embodiment of present invention;

FIGS. 9A and 9B are demonstrative illustrations of cross-sectional views and FIG. 9C is a simplified top view of layout of a semiconductor structure in a step of manufacturing thereof according to one embodiment of present invention;

FIGS. 11A and 11B are demonstrative illustrations of cross-sectional views and FIG. 11C is a simplified top view of layout of a semiconductor structure in a step of manufacturing thereof according to one embodiment of present invention;

FIGS. 12A and 12B are demonstrative illustrations of cross-sectional views and FIG. 12C is a simplified top view of layout of a semiconductor structure in a step of manufacturing thereof according to one embodiment of present invention;

FIGS. 14A and 14B are demonstrative illustrations of cross-sectional views and FIG. 14C is a simplified top view of layout of a semiconductor structure in a step of manufacturing thereof according to one embodiment of present invention;

FIGS. 15A and 15B are demonstrative illustrations of cross-sectional views and FIG. 15C is a simplified top view of layout of a semiconductor structure in a step of manufacturing thereof according to one embodiment of present invention;

FIGS. 16A and 16B are demonstrative illustrations of cross-sectional views and FIG. 16C is a simplified top view of layout of a semiconductor structure in a step of manufacturing thereof according to one embodiment of present invention.

Figure 10C:
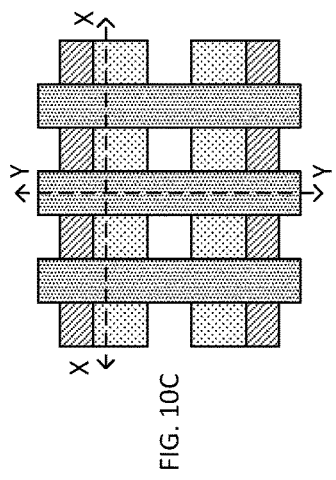
FIGS. 10A and 10B are demonstrative illustrations of cross-sectional views and FIG. 10C is a simplified top view of layout of a semiconductor structure in a step of manufacturing thereof according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1A and 1B are demonstrative illustrations of cross-sectional views of a semiconductor structure 10 in a step of manufacturing thereof according to one embodiment of present invention. As a non-limiting example, the semiconductor structure 10 may be a transistor structure such as, for example, a nanosheet transistor structure and may include or may be manufactured to include, as being described below in more details, one or more sets of nanosheets and one or more gates surrounding the one or more sets of nanosheets. FIG. 1C is a simplified top view of layout of the semiconductor structure 10.

More specifically, with reference to FIG. 1C of the simplified top view of layout, FIG. 1A illustrates a cross-sectional view of the semiconductor structure 10 along a dashed line X-X, perpendicular to the gates and FIG. 1B illustrates a cross-sectional view of the semiconductor structure 10 along a dashed line Y-Y, parallel to and at the gate. It is to be noted here that, being a simplified top view of layout, FIG. 1C may not show each and every detailed feature at the particular step of manufacturing. FIGS. 2A-2C to FIGS. 16A-16C are demonstrative illustrations of cross-sectional reviews of the semiconductor structure 10, at other manufacturing stages, and they are presented in manners similar to FIGS. 1A-1C.

Embodiments of present invention provide receiving or providing a semiconductor substrate 101 and, in one embodiment, forming one or more shallow-trench-isolation (STI) regions 102 in the semiconductor substrate 101 to define or create one or more active regions between the STI regions 102. However, embodiments of present invention are not limited in this aspect and the STI regions 102 may alternatively be formed or created at a later stage, as is described below in more details.

Embodiments of present invention further provide forming a first stack of transistors 210 that includes a first transistor 310 and a second transistor 320 and a second stack of transistors 220 that includes a third transistor 330 and a fourth transistor 340. The first, second, third, and fourth transistors 310, 320, 330, 340 may be planar transistors, fin-type transistors, vertical transistors, nanosheet transistors, or other suitable types of transistors. Hereinafter, nanosheet transistors are used as a non-limiting example for the description of embodiments of present invention.

In forming the first and the second stack of transistors 210 and 220, embodiments of present invention provide forming a first and a second stack of raw nanosheets 201 and 202 on top of the substrate 101. More particularly, the second stack of raw nanosheets 202 may first be formed on top of the substrate 101 for forming the second transistor 320 and the fourth transistor 340. A sacrificial insulation sheet 301 may subsequently be formed on top of the second stack of raw nanosheets 202. The first stack of raw nanosheets 201 may then be formed on top of the sacrificial insulation sheet 301 for forming the first transistor 310 and the third transistor 330.

In one embodiment, the STI regions 102 may be formed after the first and the second stack of raw nanosheets 201 and 202 are formed. The first and the second stack of raw nanosheets 201 and 202 may be formed by first forming or depositing a stack of semiconductor layers such as, for example, silicon (Si) layers and silicon-germanium (SiGe) layers alternately on top of the semiconductor substrate 101. This stack of semiconductor layers may then be patterned, for example, through a lithographic patterning and etching process to form the first stack of raw nanosheets 201 and the second stack of raw nanosheets 202. The sacrificial insulation sheet 301 may be formed vertically between the first and the second stack of nanosheets 201 and 202. After the patterning, the STI regions 102 may be formed in the semiconductor substrate 101 in areas not covered by the first and the second stack of raw nanosheets 201 and 202.

In one embodiment, the first stack of raw nanosheets 201 may include a set of raw nanosheets 2011 such as, for example, Si nanosheets and a set of raw suspension sheets 2012 such as, for example, SiGe sheets. The set of raw nanosheets 2011 may be separated by the set of raw suspension sheets 2012, and thus be vertically separated by a distance that equals to the thickness of each of the raw suspension sheets 2012. In one embodiment, the distance may range from about 6 nm to about 20 nm. The set of raw suspension sheets 2012 may have a first germanium (Ge) concentration level, for example, between 25% and 35% in atoms.

Similarly, the second stack of raw nanosheets 202 may include a set of raw nanosheets 2021 such as, for example, Si nanosheets and a set of raw suspension sheets 2022 such as, for example, SiGe sheets. The set of raw nanosheets 2021 may be separated by the set of raw suspension sheets 2022, and thus be vertically separated by a distance that equals to the thickness of each of the raw suspension sheets 2022. In one embodiment, the distance may range from about 6 nm to about 20 nm. The set of raw suspension sheets 2022 may have a same first Ge concentration level, for example, between 25% and 35%, although a different Ge concentration level may be used as well.

The sacrificial insulation sheet 301 may be a SiGe sheet as well with a second Ge concentration level that is, for example, between 45% and 55%. In other words, the second Ge concentration level of the sacrificial insulation sheet 301 may be different from, and larger than the first Ge concentration level of the sets of raw suspension sheets 2012 and 2022. The difference in Ge concentration level enables the sacrificial insulation sheet 301 to be selectively removed or replaced later with a raw insulation sheet, as described below in more details.

In one embodiment, the first stack of raw nanosheets 201 has a first width W1 and the second stack of raw nanosheets 202 has a second width W2 and the first width W1 is narrower than the second width W2. The sacrificial insulation sheet 301 may have a width of W2 or, alternatively, a width of W1.

The first stack of transistors 210 may have a first side and a second side that correspond, respectively, to the left side and the right side of the first and the second stack of raw nanosheets 201 and 202 as are illustrated in FIG. 1B. For the first stack of transistors 210, the left side of the first stack of raw nanosheets 201 vertically aligns with the left side of the second stack of raw nanosheets 202. Similarly, the second stack of transistors 220 may have a first side and a second side that correspond, respectively, to the right side and the left side of the first and the second stack of raw nanosheets 201 and 202 as are illustrated in FIG. 1B. For the second stack of transistors 220, the right side of the first stack of raw nanosheets 201 vertically aligns with the right side of the second stack of raw nanosheets 202. Therefore, the first side of the first stack of transistors 210 faces directly the first side of the second stack of transistors 220. In other words, the first side of the first stack of transistors 210 is directly across from the first side of the second stack of transistors 220. The first side of the first stack of transistors 210 may be referred to as being opposite the first side of the second stack of transistors 220. Hereinafter, when one side (or one element) is directly across from another side (or another element), the two sides (or the two elements) may be referred to as being opposite to each other. For example, the left side of the first and the second stack of raw nanosheets 201 and 202 is opposite to the right side of the first and the second stack of raw nanosheets 201 and 202.

FIGS. 2A and 2B are demonstrative illustrations of cross-sectional views and FIG. 2C is a simplified top view of layout of a semiconductor structure in a step of manufacturing thereof according to one embodiment of present invention. More particularly, following the step illustrated in FIGS. 1A, 1B, and 1C, embodiments of present invention provide forming a first and a second extension placeholder at the first and the second side of the first and the second stack of transistors 210 and 220.

In forming the first and the second extension placeholder, embodiments of present invention provide forming a blanket placeholder layer 401, such as a conformal SiGe layer, through an epitaxial growth process. The blanket placeholder layer 401 surrounds sidewalls of the first and the second stack of raw nanosheets 201 and 202 and may also cover the top surface of the first stack of raw nanosheets 201. Because SiGe does not epitaxially grow on top of dielectric material such as on top of the STI regions 102, the epitaxial growth process may leave the STI regions 102 at least partially exposed.

FIGS. 3A and 3B are demonstrative illustrations of cross-sectional views and FIG. 3C is a simplified top view of layout of a semiconductor structure in a step of manufacturing thereof according to one embodiment of present invention. More particularly, following the step illustrated in FIGS. 2A, 2B, and 2C, embodiments of present invention provide forming an organic planarization layer (OPL) 501 on top of the blanket placeholder layer 401. An opening may then be created in the formed OPL 501 through, for example, a lithographic patterning process to expose portions of the blanket placeholder layer 401. The exposed portions of the blanket placeholder layer 401 may be at the first sides of the first and the second stack of transistors 210 and 220. A selective etching process may subsequently be applied to remove the exposed portions of the blanket placeholder layer 401, resulting a first raw placeholder layer 402 that covers the second sides of the first and the second stack of transistors 210 and 220.

FIGS. 4A and 4B are demonstrative illustrations of cross-sectional views and FIG. 4C is a simplified top view of layout of a semiconductor structure in a step of manufacturing thereof according to one embodiment of present invention. More particularly, following the step illustrated in FIGS. 3A, 3B, and 3C, embodiments of present invention provide removing the OPL 501 that covers the first raw placeholder layer 402, and forming a second raw placeholder layer 403 in an epitaxial growth process. The second raw placeholder layer 403 may be a conformal SiGe layer as well and may be formed on top of the first raw placeholder layer 402 and on top of the exposed sidewalls of the first and the second stack of raw nanosheets 201 and 202 at the first sides of the first and the second stack of transistors 210 and 220. The first raw placeholder layer 402 and the portion of the second raw placeholder layer 403 on top of the first raw placeholder layer 402 may both be conformal SiGe layers and may be collectively referred to as a composite raw placeholder layer 404.

As being demonstratively illustrated in FIGS. 4A and 4B, the second raw placeholder layer 403, at the first side of the first and the second stack of transistors 210 and 220, may have a width D1 and the composite raw placeholder layer 404, at the second side of the first and the second stack of transistors 210 and 220, may have a width D2, and D1 may be narrower or smaller than D2. The second raw placeholder layer 403 at the first side of the first stack of transistors 210 may directly face, and be separated from, the second raw placeholder layer 403 at the first side of the second stack of transistors 220 by a gap that has a width T1. As is described below in more details, a dielectric pillar may be formed later in the gap to electrically insulate a first gate extension of the first stack of transistors 210 from a first gate extension of the second stack of transistors 220.

As being described above, the width D1 may be narrower or smaller than the width D2. By forming the second raw placeholder layer 403 and the composite raw placeholder layer 404 asymmetrically or unequally at the first and the second side of the first stack of transistors 210 (and similarly at the first and the second side of the second stack of transistors 220), embodiments of present invention enable a process of forming narrower first gate extensions of the first and the second stack of transistors 210 and 220 later at their respective first sides, thereby creating a gap between the two first sides of the first and the second stack of transistors 210 and 220, and the gap has a width that is equal to, or larger than, what is necessary, desirable, or needed in order to form proper electrical insulation between the two first gate extensions of the first and the second stack of transistors 210 and 220.

On the other hand, the width D2 of the composite raw placeholder layer 404 at the second sides of the first and the second stack of raw nanosheets 201 and 202 may be wider than a vertical gap between the raw nanosheets 2011 and/or 2021, which equals to the thickness of each of the raw suspension sheets 2012 and/or 2022 that separate the raw nanosheets 2011 and/or 2021. According to embodiments of present invention, the wider width of the composite raw placeholder layer 404 helps improve a metal fill process in a replacement-metal-gate (RMG) process later in forming metal gates surrounding the nanosheets of the transistors.

Although not explicitly illustrated here for simplicity, the raw placeholder layer and the composite placeholder layer at the first and the second side of the first and the second stack of transistors 210 and 220 may be formed by other alternative methods. In one embodiment, a method may include forming a first raw placeholder layer surrounding the sidewalls of the first and the second stack of raw nanosheets 201 and 202; forming a hard mask or a dielectric layer to cover a portion of the first raw placeholder layer at the first sides of the first and the second stack of transistors 210 and 220; forming a second raw placeholder layer at the second sides of the first and the second stack of transistors 210 and 220 on top of the first raw placeholder layer thereby forming a composite raw placeholder layer; and removing the hard mask or dielectric layer that covers the portion of the first raw placeholder layer, which therefore is not covered by the second raw placeholder layer. The process therefore creates or forms a raw placeholder layer and a composite raw placeholder layer, respectively, at the first and the second side of the first and the second stack of transistors 210 and 220. The raw placeholder layer at the first side of the first and the second stack of transistors 210 and 220 may have a width that is narrower than a width of the composite raw placeholder layer at the second side of the first and the second stack of transistors 210 and 220.

FIGS. 5A and 5B are demonstrative illustrations of cross-sectional views and FIG. 5C is a simplified top view of layout of a semiconductor structure in a step of manufacturing thereof according to one embodiment of present invention. More particularly, following the step illustrated in FIGS. 4A, 4B, and 4C, embodiments of present invention provide forming one or more dummy gates on top of the first stack of raw nanosheets 201 of the first and the second stack of transistors 210 and 220. More particularly, embodiments of present invention provide forming an interlevel dielectric (ILD) layer 511 on top of the first and the second stack of transistors 210 and 220. The ILD layer 511 may be a layer of silicon-carbon (SiC), silicon-carbon-oxide (SiOC), a combination of a thin layer of SiC and silicon-oxide ($SiO_2$), or other suitable materials. A top surface of the ILD layer 511 may then be planarized through a chemical-mechanic-polishing (CMP) process. A hard mask material layer 601 such as a layer of silicon-nitride (SiN) may then be formed on top of the ILD layer 511.

FIGS. 6A and 6B are demonstrative illustrations of cross-sectional views and FIG. 6C is a simplified top view of layout of a semiconductor structure in a step of manufacturing thereof according to one embodiment of present invention. More particularly, following the step illustrated in FIGS. 5A, 5B, and 5C, embodiments of present invention provide forming a gate mask 602 from the hard mask material layer 601, and transferring a gate pattern of the gate mask 602 onto the ILD layer 511 thereby creating a dummy gate pattern or a set of gate ILDs 512 on top of the first stack of raw nanosheets 201.

FIGS. 7A and 7B are demonstrative illustrations of cross-sectional views and FIG. 7C is a simplified top view of layout of a semiconductor structure in a step of manufacturing thereof according to one embodiment of present invention. More particularly, following the step illustrated in FIGS. 6A, 6B, and 6C, embodiments of present invention provide performing a selective etching process to etch the second raw placeholder layer 403 and the composite raw placeholder layer 404, which is a combination of the first raw placeholder layer 401 and the second raw placeholder layer 403, that are exposed by the gate mask 602 and the set of gate ILDs 512. The selective etching process creates a placeholder layer 405 underneath the set of gate ILDs 512 that surrounds the first and the second stack of raw nanosheets 201 and 202.

As being demonstratively illustrated in FIG. 7B, the placeholder layer 405 includes a first placeholder layer, at the first sides of the first and the second stack of raw nanosheets 201 and 202, formed from the second raw placeholder layer 403. The placeholder layer 405 also includes a second placeholder layer, at the right sides of the first and the second stack of raw nanosheets 201 and 202, formed from the composite raw placeholder layer 404. The selective removal of portions of the second raw placeholder layer 403 and portions of the composite raw placeholder layer 404 in the areas that are not covered by the gate mask 602 also exposes sidewalls of the sacrificial insulation sheet 301.

The exposed sacrificial insulation sheet 301 may then be selectively removed to create openings 302 between the first stack of raw nanosheets 201 and the second stack of raw nanosheets 202. The sacrificial insulation sheet 301 may be removed through a selective etching process utilizing a difference in Ge concentration level between the sacrificial insulation sheet 301, the raw suspension sheets 2012 and 2022, and the raw nanosheets 2011 and 2021. For example, because the sacrificial insulation sheet 301 has the highest Ge concentration level, relative to that of the raw suspension sheets 2012 and 2022 and the raw nanosheets 2011 and 2021, the sacrificial insulation sheet 301 may be selectively etched away first in an etchant that is specifically designed such that the raw suspension sheets 2012 and 2022 and the raw nanosheets 2011 and 2021, with their lower Ge concentration levels, may remain substantially un-etched during the etching process of the sacrificial insulation sheet 301.

FIGS. 8A and 8B are demonstrative illustrations of cross-sectional views and FIG. 8C is a simplified top view of layout of a semiconductor structure in a step of manufacturing thereof according to one embodiment of present invention. More particularly, following the step illustrated in FIGS. 7A, 7B, and 7C, embodiments of present invention provide filling the openings 302 with a dielectric material to form a raw insulation sheet 303 electrically insulating the first transistor 310 from the second transistor 320, and electrically insulating the third transistor 330 from the fourth transistor 340. The raw insulation sheet 303 may be formed through a conformal deposition process of the dielectric material, and the conformal deposition process may also form a conformal dielectric layer surrounding the set of gate ILDs 512 and the gate masks 602 on top thereof. Embodiments of present invention may further provide performing a selective and/or directional etching process to transform the conformal dielectric layer into sidewall spacers 521 at sidewalls of the set of gate ILDs 512 and the gate masks 602.

FIGS. 9A and 9B are demonstrative illustrations of cross-sectional views and FIG. 9C is a simplified top view of layout of a semiconductor structure in a step of manufacturing thereof according to one embodiment of present invention. More particularly, following the step illustrated in FIGS. 8A, 8B, and 8C, embodiments of present invention provide recessing or etching the first stack of raw nanosheets 201, the raw insulation sheet 303, and the second stack of raw nanosheets 202 to create openings for forming source/drain regions of the first, the second, the third, and the fourth transistor 310, 320, 330, and 340.

The recessing or etching process may create a first set of nanosheets 2013 from the first set of raw nanosheets 201 and a second set of nanosheets 2023 from the second set of raw nanosheets 202. The recessing process may also create a first and a second set of suspension sheets 2015 and 2025 from the sets of raw suspension sheets 2012 and 2022. The first set of nanosheets 2013 may be separated by the first set of suspension sheets 2015 and the second set of nanosheets 2023 may be separated by the second set of suspension sheets 2025. The recessing process may also create an insulation sheet 304 from the raw insulation sheet 303. The insulation sheet 304 electrically insulates the first set of nanosheets 2013 from the second set of nanosheets 2023.

Embodiments of present invention may further provide performing SiGe indentation at the ends of the suspension sheets 2015 and 2025 and subsequently filling the indentation with dielectric materials to form inner spacers 2014 and 2024. Next, source/drain regions of the second and the fourth transistors 320 and 340, such as source/drain regions 321/322 of the second transistor 320, may be formed through an epitaxial growth process of source/drain material such as, for example, boron doped SiGe or phosphorous doped Si. An insulation layer 305 may next be formed on top of the source/drain regions of the second and the fourth transistors 320 and 340, such as on top of the source/drain regions 321/322 of the second transistor 320. Source/drain regions of the first and the third transistors 310 and 330, such as source/drain regions 311/312 of the first transistor 310, may next be formed through an epitaxial growth process of source/drain material such as, for example, boron doped SiGe or phosphorous doped Si and may be formed on top of the insulation layer 305.

Embodiments of present invention further provide depositing an ILD layer 306 above the source/drain regions of the first and the third transistors 310 and 330, such as above the source/drain regions 311/312 of the first transistor 310; and forming a set of gate caps 603 on top of the ILD layer 306. The set of gate caps 603 may be formed by first recessing the ILD layer 306 to a level below the sidewall spacers 521; depositing a layer of gate-cap material such as silicon-nitride (SiN) in the recesses; and applying a CMP process to planarize a top surface of the layer of gate-cap material. Embodiments of present invention may further provide removing the gate mask 602 in a CMP process to expose the set of gate ILDs 512.

Figure 10B:
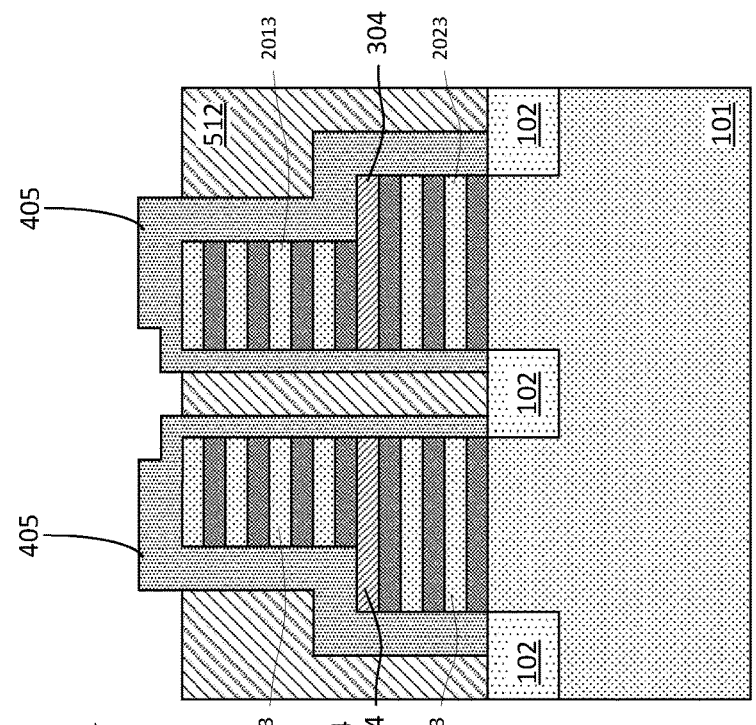
Figure 10A:
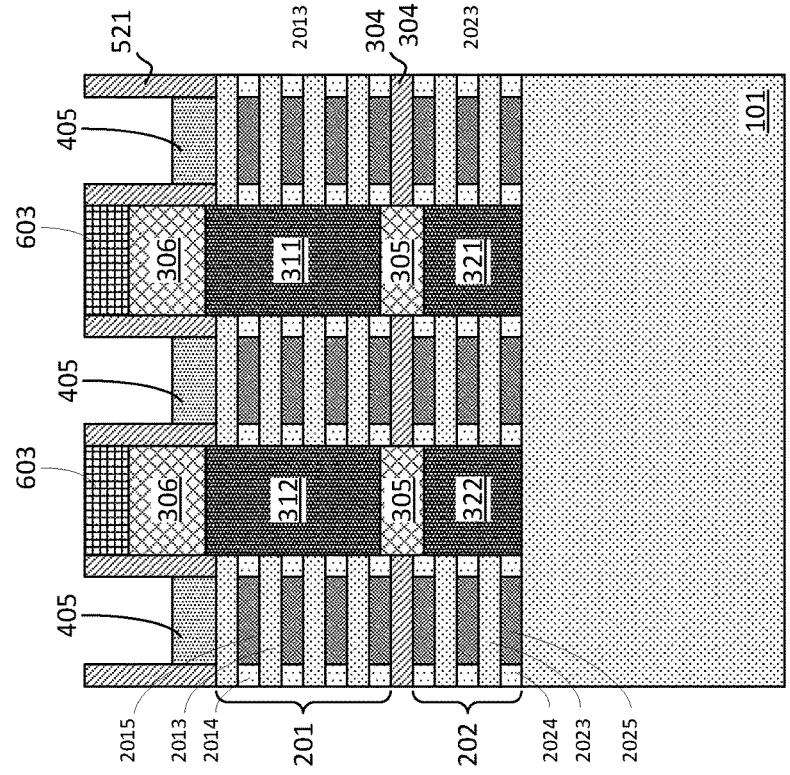

FIGS. 10A and 10B are demonstrative illustrations of cross-sectional views and FIG. 10C is a simplified top view of layout of a semiconductor structure in a step of manufacturing thereof according to one embodiment of present invention. More particularly, following the step illustrated in FIGS. 9A, 9B, and 9C, embodiments of present invention provide recessing the set of gate ILDs 512, for example through a selective etching process, to expose underneath placeholder layer 405. The set of gate ILDs 512 may be recessed such that a top surface of the placeholder layer 405 may be exposed.

FIGS. 11A and 11B are demonstrative illustrations of cross-sectional views and FIG. 11C is a simplified top view of layout of a semiconductor structure in a step of manufacturing thereof according to one embodiment of present invention. More particularly, following the step illustrated in FIGS. 10A, 10B, and 10C, embodiments of present invention provide performing a selective etching process, such as a SiGe release process, to selectively remove the sets of suspension sheets 2015 and 2025 that surround the first set of nanosheets 2013 and the second set of nanosheets 2023. The selective etching process may also remove the placeholder layer 405 at the first and the second side of the first and the second stack of transistors 210 and 220, such as at the first and the second side of the first and the second set of nanosheets 2013 and 2023. The removal of the placeholder layer 405 creates a first set of openings 391 at the first side of the first and the second set of nanosheets 2013 and 2023, and a second set of openings 392 at the second side of the first and the second set of nanosheets 2013 and 2023.

As is demonstratively illustrated in FIGS. 11A and 11B, being derived from the removal of the second raw placeholder layer 403 and the composite raw placeholder layer 404 respectively, the first set of openings 391 may have a width that is narrower than a width of the second set of openings 392. The first set of openings 391 may be created to form a first gate extension of the first and the second stack of transistors 210 and 220. On the other hand, the second set of openings 392 may be wider than the first set of openings 391 and may be created to form a second gate extension of the first and the second stack of transistors 210 and 220. In addition, the second set of openings 392 may be wider than the gaps between the first set of nanosheets 2013 and between the second set of nanosheets 2023. The wider second set of openings 392 helps a subsequent RMG process to form gate metals surrounding the first and the second set of nanosheets 2013 and 2023.

After the SiGe release process, a portion of the gate ILD 512 remains between the first stack of transistors 210 and the second stack of transistors 220 and becomes a dielectric pillar 531. More particularly, the dielectric pillar 531 remains between the first set of openings 391, which in-turn is between the first sides of the first and the second set of nanosheets 2013 and 2023. In one embodiment, the dielectric pillar 531 may have a width ranging from about 5 nm to about 50 nm.

FIGS. 12A and 12B are demonstrative illustrations of cross-sectional views and FIG. 12C is a simplified top view of layout of a semiconductor structure in a step of manufacturing thereof according to one embodiment of present invention. More particularly, following the step illustrated in FIGS. 11A, 11B, and 11C, embodiments of present invention provide performing a RMG process to fill the first and the second set of openings 391 and 392, and openings and/or gaps between the nanosheets 2013 and 2023 with a gate material. The gate materials may include, for example, a layer of gate dielectric such as $SiO_2$, $HfO_2$, HfLaOx, HfAlOx etc., a work function metal (WFM) such as TiN, TiAl, TiAlC, etc., and a conductive metal layer such as W, Al, etc. After the deposition of the conductive metal layer, a CMP process may be applied to planarize the top surface of the conductive metal layer.

The deposition of gate metal around the first set of nanosheets 2013 and the second set of nanosheets 2023 may create a first gate 313 of the first transistor 310 and a second gate 323 of the second transistor 320. As is illustrated in FIG. 12B, the first gate 313 may have a first gate extension of a width D1 at a first side of the first set of nanosheets 2013 and a second gate extension of a width D2 at a second side of the first set of nanosheets 2013. The width D1 at the first side is narrower than the width D2 at the second side. In other words, the first and the second stack of transistors 210 and 220 may have a first gate extension 307 at a first side and a second gate extension 308 at a second side. The first gate extension 307 has the width D1 that is narrower than the width D2 of the second gate extension 308.

The second gate extension 308 at the second side of the first transistor 310 may be substantially the same in width as the second gate extension 308 at the second side of the second transistor 320. Moreover, as is illustrated in FIG. 12B, the second gate extension 308 of the first transistor 310 may extend conformally into the second gate extension 308 of the second transistor 320. In other words, the second gate extensions 308 of the first and the second transistor 310 and 320 are connected by an intermediate region that has a same thickness D2 and includes a same material as that of the second gate extensions 308.

Figure 13C:
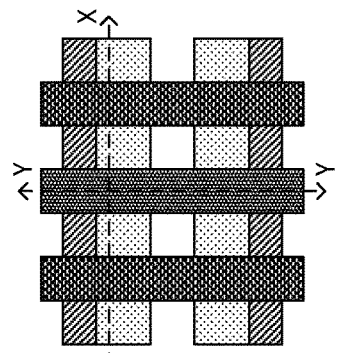
FIGS. 13A and 13B are demonstrative illustrations of cross-sectional views and FIG. 13C is a simplified top view of layout of a semiconductor structure in a step of manufacturing thereof according to one embodiment of present invention.
Figure 13B:
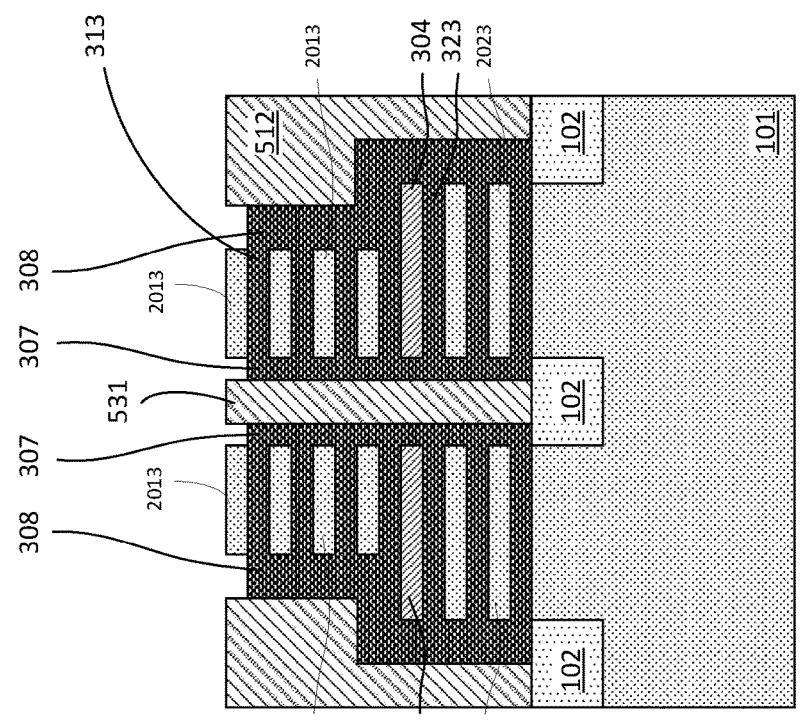
Figure 13A:
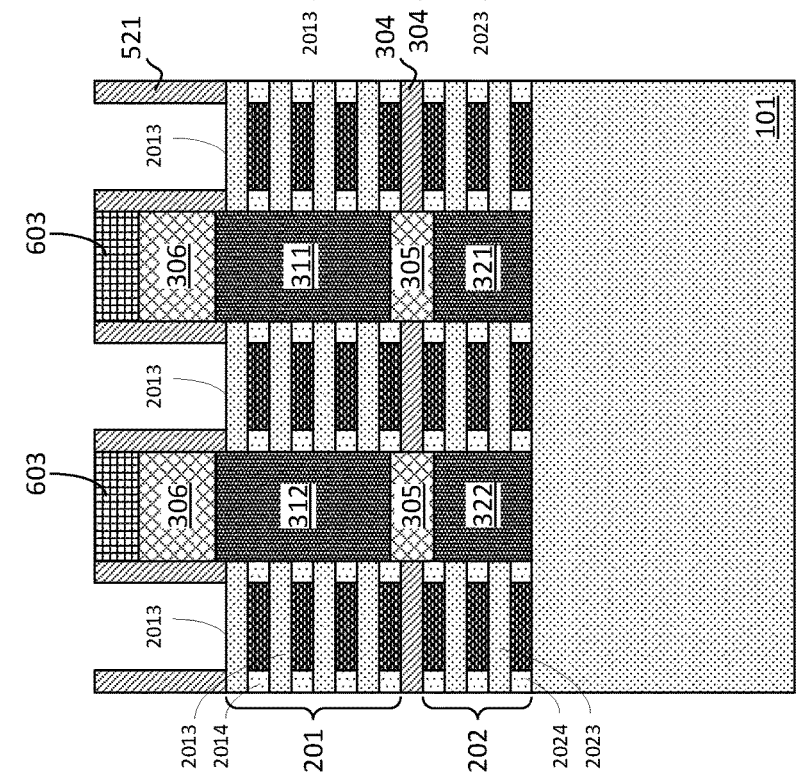

FIGS. 13A and 13B are demonstrative illustrations of cross-sectional views and FIG. 13C is a simplified top view of layout of a semiconductor structure in a step of manufacturing thereof according to one embodiment of present invention. More particularly, following the step illustrated in FIGS. 12A, 12B, and 12C, embodiments of present invention provide recessing the gate material above the first set of nanosheets 2013 until a top nanosheet 2013 of the first set of nanosheets 2013 is exposed.

FIGS. 14A and 14B are demonstrative illustrations of cross-sectional views and FIG. 14C is a simplified top view of layout of a semiconductor structure in a step of manufacturing thereof according to one embodiment of present invention. More particularly, following the step illustrated in FIGS. 13A, 13B, and 13C, embodiments of present invention provide removing the top nanosheet 2013 of the first set of nanosheets 2013 through a selective etching process. The removal of the top nanosheet 2013 may be optionally since the top nanosheet 2013 may not have sufficient gate metal on top thereof or it may be difficult to form an adequate amount of gate metal surrounding the top nanosheet 2013, in order for the top nanosheet 2013 to function properly as part of the first transistor 310 and/or as part of the third transistor 330.

FIGS. 15A and 15B are demonstrative illustrations of cross-sectional views and FIG. 15C is a simplified top view of layout of a semiconductor structure in a step of manufacturing thereof according to one embodiment of present invention. More particularly, following the step illustrated in FIGS. 14A, 14B, and 14C, embodiments of present invention provide forming a dielectric cap layer on top of the first gate 313 of the first transistor 310 and the third gate of the third transistor 330 to form a self-aligned contact (SAC) cap layer 701. A CMP process may subsequently be applied to planarize the top surface of the SAC cap layer 701.

FIGS. 16A and 16B are demonstrative illustrations of cross-sectional views and FIG. 16C is a simplified top view of layout of a semiconductor structure in a step of manufacturing thereof according to one embodiment of present invention. More particularly, following the step illustrated in FIGS. 15A, 15B, and 15C, embodiments of present invention provide forming an ILD layer 702 on top of the SAC cap layer 701, and subsequently forming one or more middle-of-line (MOL) contact structures through the ILD layer 702 to be in contact with one or more of the first and the third transistors 310 and 330. For example, source/drain contacts 811 and 812 may be formed through the ILD layer 702 and the ILD layer 306 to be in contact with the source/drain regions 311/312 of the first transistor 310, and gate contacts 821 and 822 may be formed to be in contact with the first gate 313 of the first transistor 310 and the third gate of the third transistor 330.

Figure 17:
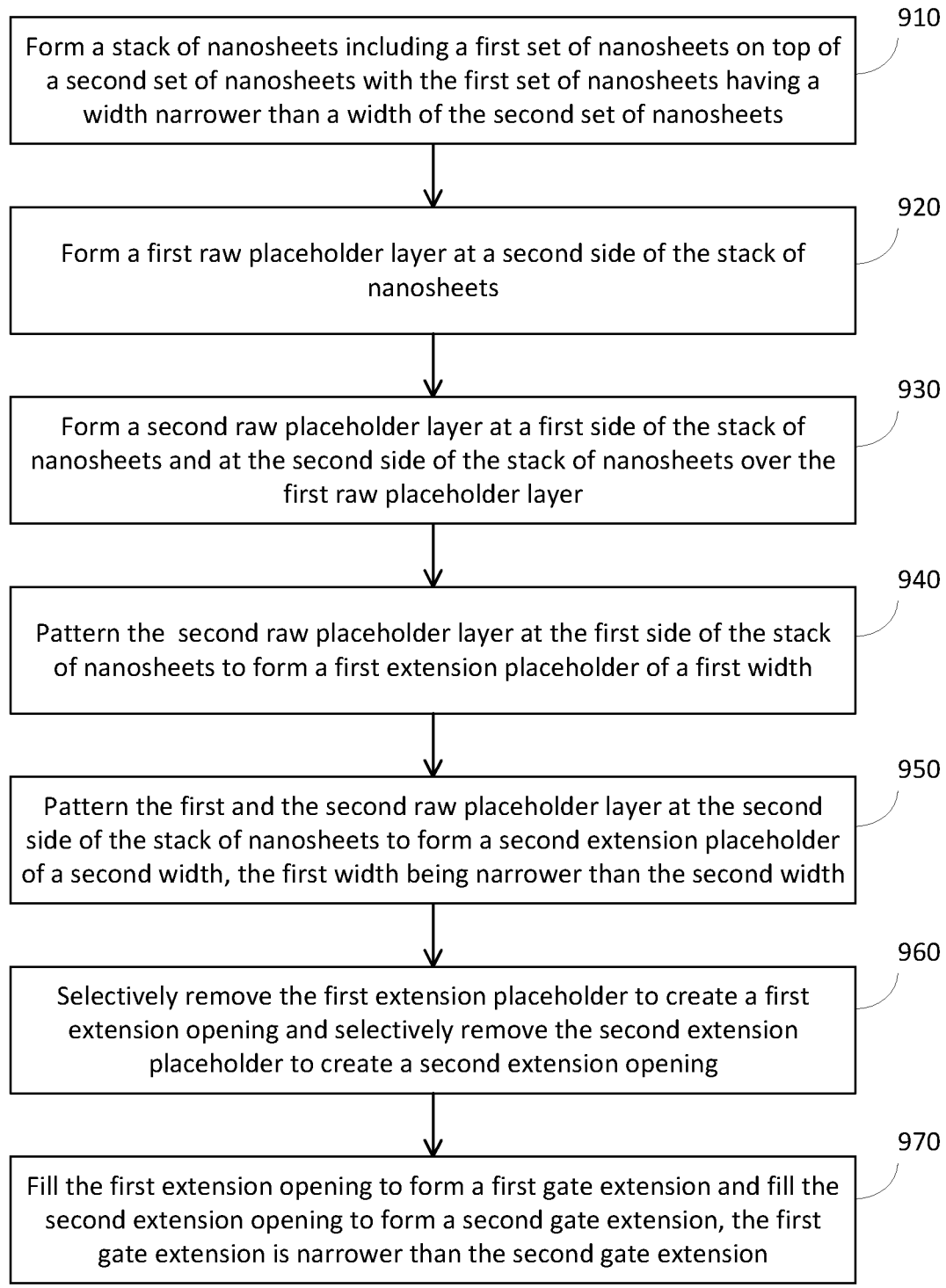
FIG. 17 is a demonstrative illustration of a flow-chart of a method of manufacturing a semiconductor structure according to embodiments of present invention.

FIG. 17 is a demonstrative illustration of a flow-chart of a method of manufacturing a semiconductor structure according to embodiments of present invention. The method includes (910) forming a stack of nanosheets including a first set of nanosheets on top of a second set of nanosheets, with the first set of nanosheets having a width narrower than a width of the second set of nanosheets; (920) forming a first raw placeholder layer at a second side of the stack of nanosheets; (930) forming a second raw placeholder layer at a first side of the stack of nanosheets and at the second side of the stack of nanosheets over the first raw placeholder layer; (940) patterning the second raw placeholder layer at the first side of the stack of nanosheets to form a first extension placeholder that has a first width; (950) patterning the first and the second raw placeholder layer at the second side of the stack of nanosheets to form a second extension placeholder that has a second width, with the first width of the first extension placeholder being narrower than the second width of the second extension placeholder; (960) selectively removing the first extension placeholder to create a first extension opening and selectively removing the second extension placeholder to create a second extension opening; and (970) filling the first extension opening to form a first gate extension and filling the second extension placeholder to form a second gate extension, where the first gate extension has the width of the first extension placeholder and the second gate extension has the width of the second extension placeholder, therefore the first gate extension is narrower than the second gate extension.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:
    a stack of transistors with a first transistor on top of a second transistor, wherein a gate of the first transistor has a first width; a gate of the second transistor has a second width; and the first width is narrower than the second width,
    wherein the first and the second transistor respectively have a first gate extension at a first side of the stack and a second gate extension at a second side of the stack, the first gate extension at the first side of the stack being narrower than the second gate extension at the second side of the stack, the first side being opposite the second side.

2. The semiconductor structure of claim 1, wherein the second gate extensions of the first and the second transistor at the second side of the stack are conformal, and the second gate extension of the first transistor conformally extends into the second gate extension of the second transistor.

3. The semiconductor structure of claim 1, wherein the gate of the first transistor vertically aligns with the gate of the second transistor at the first side of the stack.

4. The semiconductor structure of claim 1, wherein the first and the second transistor are a first and a second nanosheet transistor having a first and a second set of nanosheets respectively, and the first width of the gate of the first transistor equals to a width of the first set of nanosheets and the second width of the gate of the second transistor equals to a width of the second set of nanosheets.

5. The semiconductor structure of claim 4, wherein the first set of nanosheets are vertically separated by a distance ranging from about 6 nm to about 20 nm.

6. The semiconductor structure of claim 1, wherein the stack of transistors is a first stack of transistors, further comprising:
    a second stack of transistors with a third transistor on top of a fourth transistor, wherein a gate of the third transistor has a third width; a gate of the fourth transistor has a fourth width; and the third width is narrower than the fourth width,
    wherein the second stack of transistors being opposite the first side of the first stack of transistors, and wherein the third and the fourth transistor respectively have a third gate extension at a first side of the second stack and a fourth gate extension at a second side of the second stack, the third gate extension at the first side of the second stack being narrower than the fourth gate extension at the second side of the second stack, the second side of the second stack being opposite the first side of the second stack.

7. The semiconductor structure of claim 6, wherein the first gate extensions of the first and the second transistor are separated from the third gate extensions of the third and the fourth transistor by a dielectric pillar, the dielectric pillar having a width ranging from about 5 nm to about 50 nm.

8. The semiconductor structure of claim 6, wherein the first gate extension and the third gate extension have a substantially same first width, and the second gate extension and the fourth gate extension have a substantially same second width, the first width of the first gate extension being narrower than the second width of the second gate extension.

9. A method of forming a semiconductor structure comprising:
    forming a stack of nanosheets including a first set of nanosheets on top of a second set of nanosheets, the first set of nanosheets having a first width, the second set of nanosheets having a second width, and the first width being narrower than the second width; and
    forming a first gate extension on a first side of the stack of nanosheets and a second gate extension on a second side of the stack of nanosheets, the first side being opposite the second side, and the first gate extension being narrower than the second gate extension.

10. The method of claim 9, wherein forming the first gate extension and the second gate extension comprises:
    forming a first extension placeholder at the first side of the stack of nanosheets and a second extension placeholder at the second side of the stack of nanosheets; and
    replacing the first extension placeholder with the first gate extension and the second extension placeholder with the second gate extension in a replacement-metal-gate process.

11. The method of claim 10, wherein forming the first extension placeholder and the second extension placeholder comprises:
    forming a first raw placeholder layer at the second side of the stack of nanosheets;
    forming a second raw placeholder layer at the first side of the stack of nanosheets and at the second side of the stack of nanosheets over the first raw placeholder layer;
    patterning the second raw placeholder layer at the first side of the stack of nanosheets to form the first extension placeholder; and
    patterning the first and the second raw placeholder layer at the second side of the stack of nanosheets to form the second extension placeholder.

12. The method of claim 10, wherein forming the first extension placeholder and the second extension placeholder comprises:
    forming a first raw placeholder layer at the first and the second side of the stack of nanosheets;
    forming a second raw placeholder layer at the second side of the stack of nanosheets over the first raw placeholder layer;
    patterning the first raw placeholder layer at the first side of the stack of nanosheets to form the first extension placeholder; and
    patterning the first and the second raw placeholder layer at the second side of the stack of nanosheets to form the second extension placeholder.

13. The method of claim 9, wherein forming the stack of nanosheets comprises:

forming a second set of raw nanosheets on a semiconductor substrate, the second set of raw nanosheets are separated by a second set of raw suspension sheets;

forming a sacrificial insulation sheet above the second set of raw nanosheets;

forming a first set of raw nanosheets above the sacrificial insulation sheet, the first set of raw nanosheets are separated by a first set of raw suspension sheets; and patterning the first and the second set of raw nanosheets to create the first and the second set of nanosheets in a selective etching process.

14. The method of claim 13, further comprising:

removing the sacrificial insulation sheet in a selective etching process to create an opening between the first and the second set of raw nanosheets; and forming a raw insulation sheet by depositing a dielectric material in the opening, wherein the first and the second set of raw suspension sheets are silicon-germanium (SiGe) sheets having a first germanium (Ge) concentration level and the sacrificial insulation sheet is a SiGe sheet having a second Ge concentration level, the second Ge concentration level being larger than the first Ge concentration level.

15. The method of claim 9, wherein the stack of nanosheets is a first stack of nanosheets, further comprising:

forming a second stack of nanosheets opposite the first side of the first stack of nanosheets, wherein the second stack of nanosheets includes a third set of nanosheets on top of a fourth set of nanosheets, the third set of nanosheets having a third width, the fourth set of nanosheets having a fourth width, the third width being narrower than the fourth width.

16. A semiconductor structure comprising:

a first stack of transistors with a first transistor on top of a second transistor, wherein a gate of the first transistor has a first width, and a gate of the second transistor has a second width, with the first width being narrower than the second width; and a second stack of transistors with a third transistor on top of a fourth transistor, wherein a gate of the third transistor has a third width, and a gate of the fourth transistor has a fourth width, with the third width being narrower than the fourth width, wherein the first and the second transistor respectively have a first gate extension at a first side of the first stack and a second gate extension at a second side of the first stack, the first gate extension being narrower than the second gate extension, and wherein the third and the fourth transistor respectively have a third gate extension at a first side of the second stack and a fourth gate extension at a second side of the second stack, the third gate extension being narrower than the fourth gate extension.

17. The semiconductor structure of claim 16, wherein the second gate extensions of the first and the second transistor at the second side of the first stack are conformal, and the second gate extension of the first transistor conformally extends into the second gate extension of the second transistor.

18. The semiconductor structure of claim 16, wherein the gate of the first transistor vertically aligns with the gate of the second transistor at the first side of the first stack, and wherein the gate of the third transistor vertically aligns with the gate of the fourth transistor at the first side of the second stack.

19. The semiconductor structure of claim 18, wherein the first side of the first stack of transistors faces the first side of the second stack of transistors.

20. The semiconductor structure of claim 18, wherein the first side of the first stack of transistors is insulated from the first side of the second stack of transistors by a dielectric pillar, the dielectric pillar having a width ranging from about 5 nm to about 50 nm.

* * * * *